US012219278B2

(12) United States Patent
Morimoto et al.

(10) Patent No.: US 12,219,278 B2
(45) Date of Patent: Feb. 4, 2025

(54) PROCESSING APPARATUS AND PHOTOELECTRIC CONVERSION SYSTEM

(71) Applicant: CANON KABUSHIKI KAISHA, Tokyo (JP)

(72) Inventors: Kazuhiro Morimoto, Kanagawa (JP); Hiroshi Sekine, Kanagawa (JP)

(73) Assignee: Canon Kabushiki Kaisha, Tokyo (JP)

( * ) Notice: Subject to any disclaimer, the term of this patent is extended or adjusted under 35 U.S.C. 154(b) by 154 days.

(21) Appl. No.: 18/167,004

(22) Filed: Feb. 9, 2023

(65) Prior Publication Data

US 2023/0262354 A1    Aug. 17, 2023

(30) Foreign Application Priority Data

| Feb. 15, 2022 | (JP) | 2022-021461 |
| Mar. 7, 2022 | (JP) | 2022-034577 |
| Nov. 28, 2022 | (JP) | 2022-188829 |

(51) Int. Cl.
| *H04N 25/68* | (2023.01) |
| *H01L 27/142* | (2014.01) |
| *H01L 27/146* | (2006.01) |
| *H01L 31/02* | (2006.01) |

(52) U.S. Cl.
CPC ........... *H04N 25/68* (2023.01); *H01L 27/142* (2013.01); *H01L 27/14643* (2013.01); *H01L 31/02027* (2013.01)

(58) Field of Classification Search
None
See application file for complete search history.

(56) References Cited

U.S. PATENT DOCUMENTS

| 8,310,570 | B1* | 11/2012 | Aldrich | H04N 25/68 |
| | | | | 348/246 |
| 2004/0096125 | A1 | 5/2004 | Alderson | |
| 2007/0030365 | A1 | 2/2007 | Jerdev | |
| 2007/0194249 | A1 | 8/2007 | Gavrilov | |
| 2010/0066871 | A1* | 3/2010 | Atanassov | H04N 25/683 |
| | | | | 348/E9.037 |
| 2013/0070128 | A1 | 3/2013 | Suzuki | |
| 2013/0229550 | A1* | 9/2013 | Nakao | H04N 25/68 |
| | | | | 348/246 |
| 2013/0321671 | A1* | 12/2013 | Cote | H04N 25/673 |
| | | | | 348/241 |
| 2017/0180722 | A1* | 6/2017 | Manbeck | G06T 5/77 |
| 2019/0189827 | A1 | 6/2019 | Haraguchi | |
| 2021/0110787 | A1 | 4/2021 | Edward | |

FOREIGN PATENT DOCUMENTS

| JP | 2011066800 A | 3/2011 |
| JP | 2020198601 A | 12/2020 |
| JP | 2021090134 A | 6/2021 |
| WO | 2019228944 A1 | 12/2019 |
| WO | 2021172216 A1 | 9/2021 |

\* cited by examiner

*Primary Examiner* — Quan Pham
(74) *Attorney, Agent, or Firm* — Canon U.S.A., Inc. IP Division

(57) ABSTRACT

A processing apparatus includes a first storage unit for storing first array data that is based on output values of a plurality of pixels arranged in an array, a second storage unit having second array data stored therein to be used for correction of the output values from the plurality of pixels, and a correction unit including a calculation unit that corrects an output value of at least one pixel of the plurality of pixels based on the first array data and the second array data.

24 Claims, 27 Drawing Sheets

FIG.6
(a) CLUSTER FLAW BEFORE CORRECTION
(c) AFTER CORRECTION (RESIDUAL FLAW EXISTS)
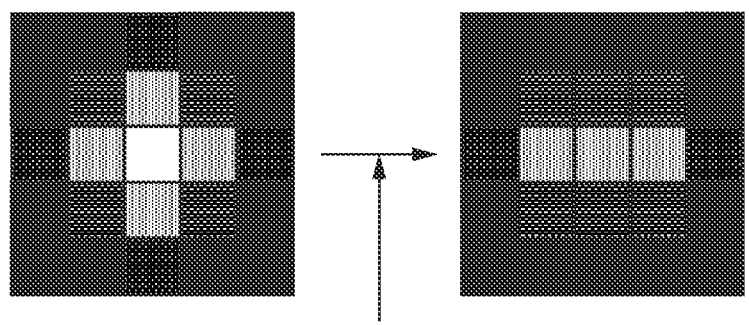
(b) FLAW CORRECTION OF COMPARATIVE EXAMPLE
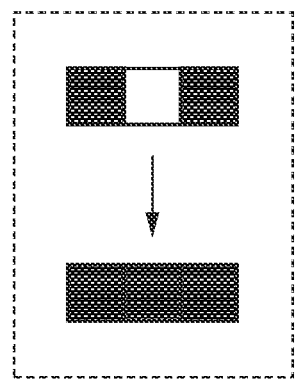

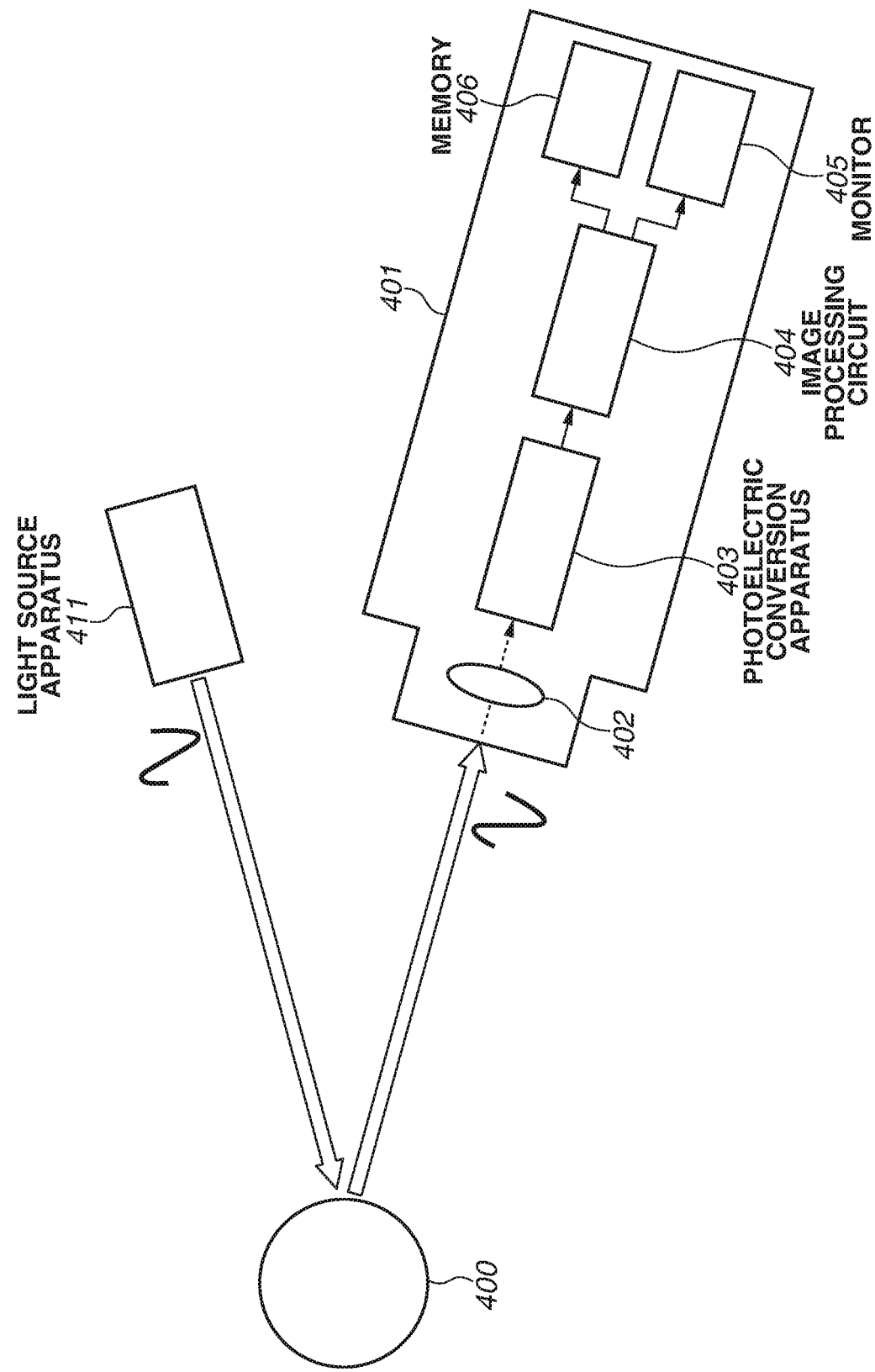

PROCESSING APPARATUS AND PHOTOELECTRIC CONVERSION SYSTEM

BACKGROUND OF THE INVENTION

Field of the Invention

The present invention relates to a processing apparatus and a photoelectric conversion system.

Description of the Related Art

As a flaw correction unit, there has been known a method of extracting a pixel, as a flaw pixel, with an output level higher than surrounding pixels, and replacing an output of the flaw pixel with an average value of outputs of the surrounding pixels.

Nevertheless, in the correction method discussed in the specification of United States Patent Application Publication No. 2007-030365, there has been an issue that the accuracy of flaw correction deteriorates and thereby image quality deteriorates. The present invention has been devised in view of the above-described issue, and aims to prevent image quality deterioration by improving flaw correction accuracy.

SUMMARY OF THE INVENTION

According to an aspect of the present invention, a processing apparatus includes a first storage unit for storing first array data that is based on output values of a plurality of pixels arranged in an array, a second storage unit having second array data stored therein to be used for correction of the output values from the plurality of pixels, and a correction unit including a calculation unit that corrects an output value of at least one pixel of the plurality of pixels based on the first array data and the second array data.

Further features of the present invention will become apparent from the following description of embodiments with reference to the attached drawings.

BRIEF DESCRIPTION OF THE DRAWINGS

FIG. 6 is an explanatory diagram of a processing apparatus according to a comparative example of a first embodiment.

FIG. 25 is a functional block diagram of a photoelectric conversion system including a processing apparatus according to a tenth embodiment.

DESCRIPTION OF THE EMBODIMENTS

Figure 1:
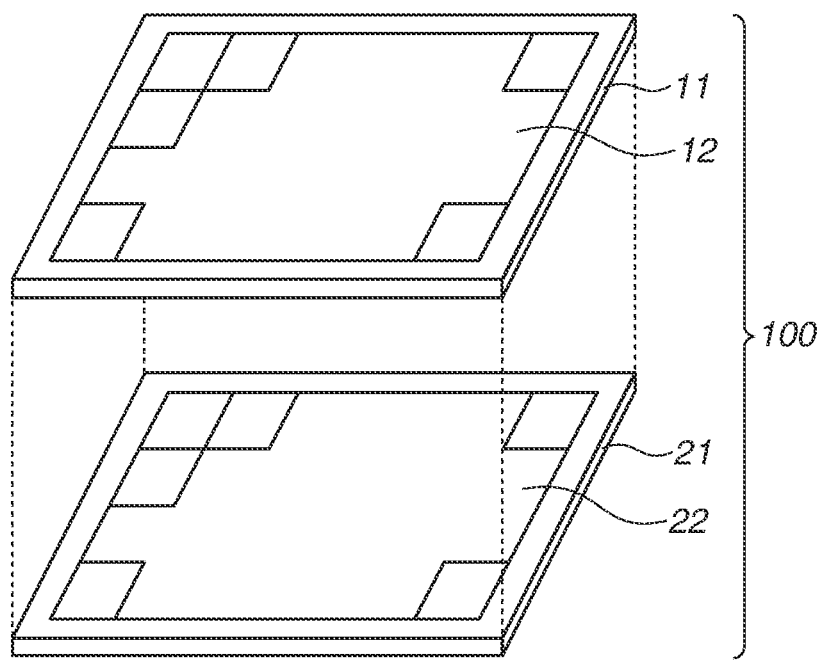
FIG. 1 is a schematic view of a photoelectric conversion apparatus that can be used together with a processing apparatus according to an embodiment.

The following embodiments are provided for embodying the technical idea of the present invention, and are not intended to limit the present invention. The sizes and the positional relationship of members illustrated in the drawings are sometimes exaggerated for clarifying the description. In the following description, the same components are assigned the same reference numerals, and the description thereof will be sometimes omitted.

Hereinafter, embodiments of the present invention will be described in detail with reference to the drawings. In the following description, terms (e.g., "up", "down", "right", "left", and other terms including these terms) indicating specific directions and positions are used as necessary. These terms are used to facilitate the understanding of an embodiment to be described with reference to the drawings. The technical scope of the present invention is not limited by the meanings of these terms.

In this specification, a "planar view" refers to a view from a direction vertical to a light incidence surface of a semiconductor layer. A cross section refers to a surface in the direction vertical to the light incidence surface of the semiconductor layer. In a case where the light incidence surface of the semiconductor layer is a rough surface when viewed microscopically, a planar view is defined based on a light incidence surface of a semiconductor layer that is viewed macroscopically.

In the following description, an anode of an avalanche photodiode (APD) is set to a fixed potential, and signals are taken out from a cathode side. Thus, a semiconductor region of a first conductivity type in which charges of the same polarity as the polarity of signal charges are regarded as majority carriers is an N-type semiconductor region, and a semiconductor region of a second conductivity type in which charges of a polarity different from the polarity of signal charges are regarded as majority carriers is a P-type semiconductor region.

Even in a case where a cathode of an APD is set to a fixed potential, and signals are taken out from an anode side, the present invention can be realized. In this case, a semiconductor region of a first conductivity type in which charges of the same polarity as the polarity of signal charges are regarded as majority carriers is a P-type semiconductor region, and a semiconductor region of a second conductivity type in which charges of a polarity different from the polarity of signal charges are regarded as majority carriers is an N-type semiconductor region. The following description will be given of a case where one node of an APD is set to a fixed potential, but potentials of both nodes may be made variable.

In this specification, in a case where a term "impurity concentration" is used, the term means a net impurity concentration obtained by subtracting an amount compensated by an impurity of an opposite conductivity type. In short, the "impurity concentration" refers to a NET doping concentration. A region in which a P-type additive impurity concentration is higher than an N-type additive impurity concentration is the P-type semiconductor region. In contrast, a region in which an N-type additive impurity concentration is higher than a P-type additive impurity concentration is the N-type semiconductor region.

Configurations of a photoelectric conversion apparatus that can be used together with a processing apparatus according to an embodiment of the present invention, and its driving method that are common to embodiments will be described with reference to FIGS. 1 to 5A, 5B, and 5C. The following description will be given of the processing apparatus provided on the outside of the photoelectric conversion apparatus, but the processing apparatus may be included in, for example, the photoelectric conversion apparatus.

FIG. 1 is a diagram illustrating a configuration of a stack-type photoelectric conversion apparatus 100 according to an embodiment of the present invention.

The photoelectric conversion apparatus 100 includes two stacked substrates corresponding to a sensor substrate 11 and a circuit substrate 21, which are electrically connected. The sensor substrate 11 includes a first semiconductor layer including a photoelectric conversion element 102 to be described below, and a first wiring structure. The circuit substrate 21 includes a second semiconductor layer including a circuit (e.g., a signal processing unit 103 to be described below), and a second wiring structure. The photoelectric conversion apparatus 100 includes the second semiconductor layer, the second wiring structure, the first wiring structure, and the first semiconductor layer, which are stacked in this order. The photoelectric conversion apparatus described in each embodiment is a back-illuminated photoelectric conversion apparatus that receives light entering from a first surface, and includes a circuit substrate arranged on a second surface.

Hereinafter, the sensor substrate 11 and the circuit substrate 21 will be described as diced chips, but the sensor substrate 11 and the circuit substrate 21 are not limited to such chips. For example, each substrate may be a wafer. Alternatively, the substrates may be diced after being stacked in a wafer state, or may be diced into chips and then jointed by stacking the chips.

A pixel region 12 is arranged on the sensor substrate 11, and a circuit region 22 for processing signals detected in the pixel region 12 is arranged on the circuit substrate 21.

Figure 2:
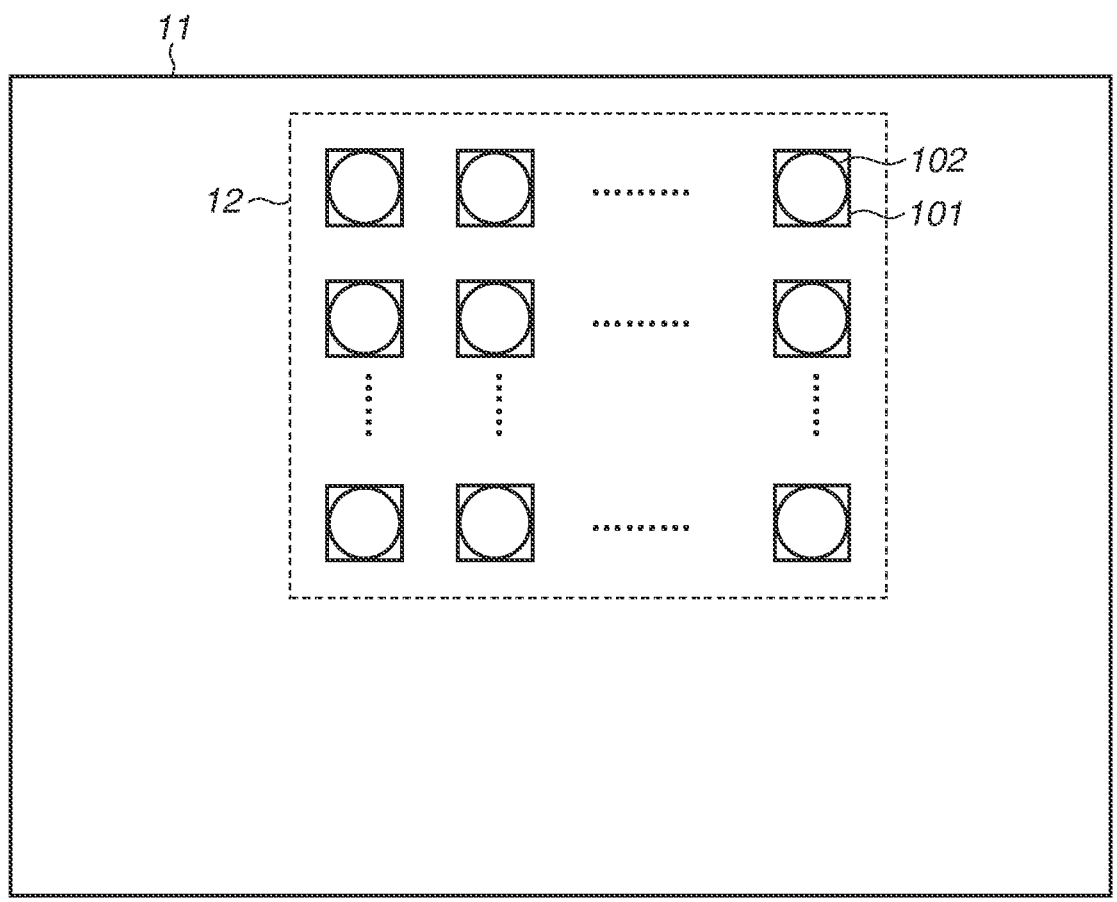
FIG. 2 is a schematic view of a photodiode (PD) substrate of a photoelectric conversion apparatus that can be used together with a processing apparatus according to an embodiment.

FIG. 2 is a diagram illustrating an arrangement example of the sensor substrate 11. Pixels 101 each including the photoelectric conversion element 102 including an APD are arranged in a two-dimensional array in a planar view, and form the pixel region 12.

The pixel 101 is typically a pixel for forming an image. In a case where the pixel 101 is used as a time of flight (TOF) sensor, an image needs not be always formed. In other words, the pixel 101 may be a pixel for measuring a time at which light reaches, and for measuring a light amount.

Figure 3:
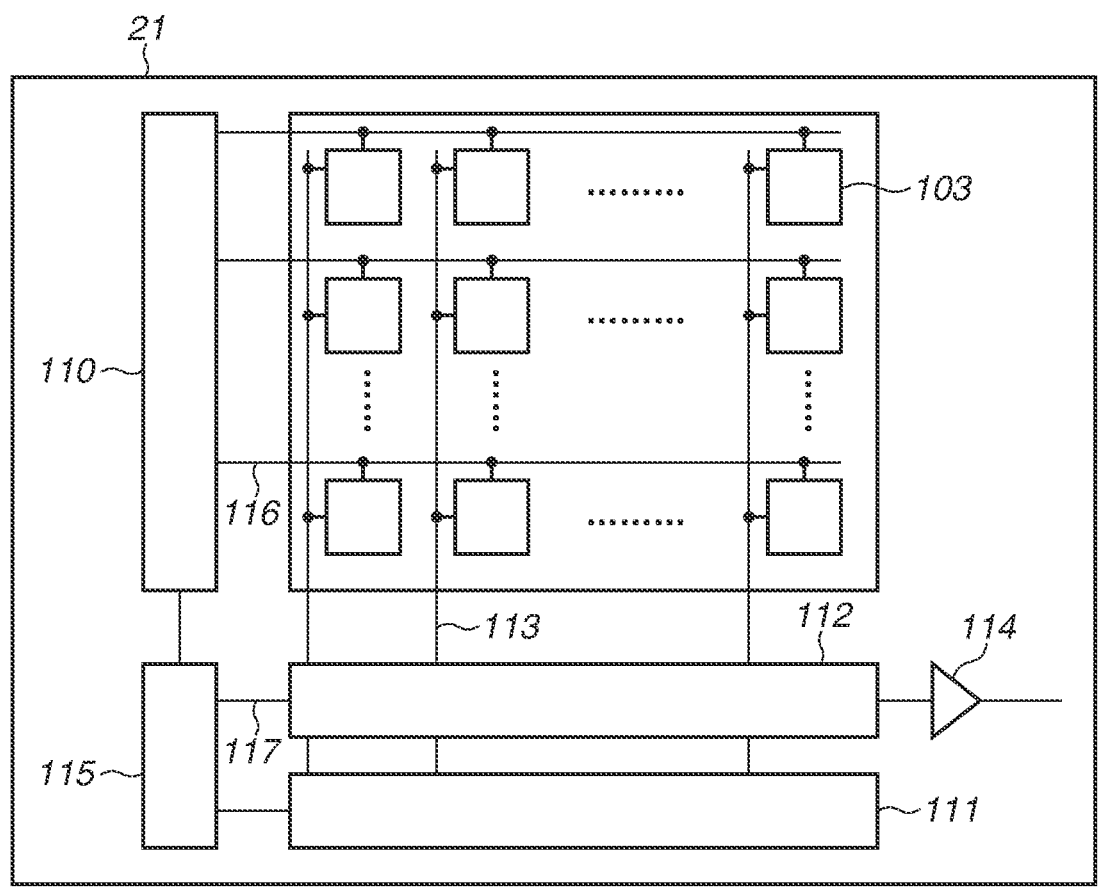
FIG. 3 is a schematic view of a circuit substrate of a photoelectric conversion apparatus that can be used together with a processing apparatus according to an embodiment.

FIG. 3 is a configuration diagram of the circuit substrate 21. The circuit substrate 21 includes the signal processing unit 103 that processes charges photoelectrically-converted by the photoelectric conversion element 102 illustrated in FIG. 2, a readout circuit 112, a control pulse generation unit 115, a horizontal scanning circuit unit 111, a signal line 113, and a vertical scanning circuit unit 110.

The photoelectric conversion element 102 illustrated in FIG. 2, and the signal processing unit 103 illustrated in FIG. 3 are electrically connected via a connection wire provided for each pixel.

The vertical scanning circuit unit 110 receives a control pulse supplied from the control pulse generation unit 115, and supplies the control pulse to each pixel. A logic circuit, such as a shift register or an address decoder, is used as the vertical scanning circuit unit 110.

A signal output from the photoelectric conversion element 102 of a pixel is processed by the signal processing unit 103. A counter and a memory are provided in the signal processing unit 103, and a digital value is stored in the memory.

The horizontal scanning circuit unit 111 inputs, to the signal processing unit 103, a control pulse for sequentially selecting each column to read out a signal from the memory of each pixel that stores a digital signal.

A signal is output to the signal line 113 from the signal processing unit 103 of a pixel on a selected column that has been selected by the vertical scanning circuit unit 110.

The signal output to the signal line 113 is output via an output circuit 114 to a recording unit or a signal processing unit that is provided on the outside of the photoelectric conversion apparatus 100.

In FIG. 2, photoelectric conversion elements in a pixel region may be one-dimensionally arrayed. The function of the signal processing unit needs not be always provided for each of all photoelectric conversion elements. For example, one signal processing unit can be shared by a plurality of photoelectric conversion elements, and signal processing can be sequentially performed.

As illustrated in FIGS. 2 and 3, a plurality of signal processing units 103 is arranged in a region overlapping the pixel region 12 in a planar view. The vertical scanning circuit unit 110, the horizontal scanning circuit unit 111, the readout circuit 112, the output circuit 114, and the control pulse generation unit 115 are then arranged in such a manner as to overlap, in a planar view, a region defined by the ends of the sensor substrate 11 and the ends of the pixel region 12. In other words, the sensor substrate 11 includes the pixel region 12, and a non-pixel region arranged around the pixel region 12. The vertical scanning circuit unit 110, the horizontal scanning circuit unit 111, the readout circuit 112, output circuit 114, and the control pulse generation unit 115 are then arranged in a region overlapping the non-pixel region in a planar view.

Figure 4:
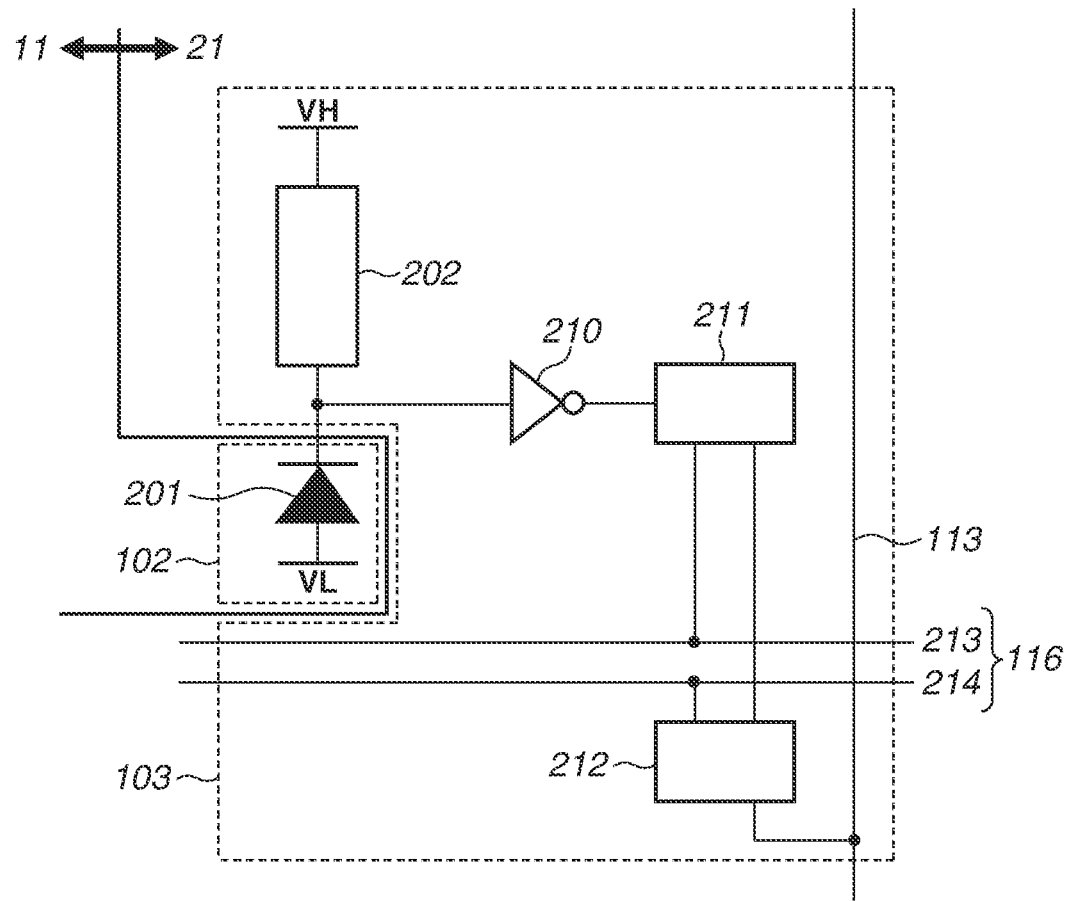
FIG. 4 illustrates a configuration example of a pixel circuit of a photoelectric conversion apparatus that can be used together with a processing apparatus according to an embodiment.

FIG. 4 illustrates an example of a block diagram including an equivalent circuit of FIGS. 2 and 3.

In FIG. 4, the photoelectric conversion element 102 including an APD 201 is provided on the sensor substrate 11, and other members are provided on the circuit substrate 21.

The APD 201 is a photoelectric conversion unit that generates a charge pair corresponding to incident light, by photoelectric conversion.

A voltage VL (first voltage) is supplied to an anode of the APD 201. A voltage VH (second voltage) higher than the voltage VL supplied to the anode is supplied to a cathode of the APD 201. Inversely-biased voltages for causing the APD 201 to perform an avalanche multiplication operation are supplied to the anode and the cathode. By causing a state in which such voltages are supplied, charges generated by incident light cause avalanche multiplication, and an avalanche current is generated.

In a case where inversely-biased voltages are supplied, an APD is operated in a Geiger mode or a linear mode. In the Geiger mode, an APD is operated with a potential difference between the anode and the cathode that is larger than a breakdown voltage. In the linear mode, an APD is operated with a potential difference between the anode and the cathode that is near the breakdown voltage, or with a voltage difference equal to or smaller than the breakdown voltage.

An APD operated in the Geiger mode will be referred to as a single photon avalanche photodiode (SPAD). For example, the voltage VL (first voltage) is −30 V and the voltage VH (second voltage) is 1 V. The APD 201 can be operated in the linear mode, or can be operated in the Geiger mode. Because a potential difference of the SPAD becomes larger and a pressure resistance effect of the SPAD becomes more prominent as compared with an APD in the linear mode, the SPAD is desirably used.

A quench element 202 is connected to the APD 201 and a power source that supplies the voltage VH. The quench element 202 functions as a load circuit (quench circuit) when a signal is multiplied by avalanche multiplication, and has a function of suppressing avalanche multiplication by reducing a voltage to be supplied to the APD 201 (quench operation). The quench element 202 also has a function of returning a voltage to be supplied to the APD 201, to the voltage VH (recharge operation) by flowing a current by an amount corresponding to a voltage drop caused by the quench operation.

The signal processing unit 103 includes a waveform shaping unit 210, a counter circuit 211, and a selection circuit 212. In this specification, the signal processing unit 103 is only required to include any of the waveform shaping unit 210, the counter circuit 211, and the selection circuit 212.

The waveform shaping unit 210 outputs a pulse signal by shaping a potential change of the cathode of the APD 201 that is obtained at the time of photon detection. Examples of the waveform shaping unit 210 include an inverter circuit. FIG. 4 illustrates an example in which one inverter is used as the waveform shaping unit 210, but a circuit in which a plurality of inverters is connected in series can be used, or another circuit having a waveform shaping effect can be used.

The counter circuit 211 counts the number of pulse signals output from the waveform shaping unit 210, and holds a count value. When a control pulse pRES is supplied via a drive line 213, the number of pulse signals that is held in the counter circuit 211 is reset.

A control pulse pSEL is supplied to the selection circuit 212 from the vertical scanning circuit unit 110 illustrated in FIG. 3, via a drive line 214 illustrated in FIG. 4 (not illustrated in FIG. 3), and electric connection and separation between the counter circuit 211 and the signal line 113 are selected. The selection circuit 212 includes, for example, a buffer circuit for outputting a signal.

Electric connection can be switched by arranging a switch, such as a transistor, between the quench element 202 and the APD 201, or between the photoelectric conversion element 102 and the signal processing unit 103. Similarly, the supply of the voltage VH or the voltage VL to be supplied to the photoelectric conversion element 102 can be electrically switched using a switch, such as a transistor.

In the present embodiment, the configuration using the counter circuit 211 has been described. Nevertheless, the photoelectric conversion apparatus 100 can acquire a pulse detection timing using a time to digital converter (hereinafter, TDC) and a memory, in place of the counter circuit 211. At this time, the generation timing of a pulse signal output from the waveform shaping unit 210 is converted into a digital signal by the TDC. To measure the timing of a pulse signal, a control pulse pREF (reference signal) is supplied via a drive line to the TDC from the vertical scanning circuit unit 110 illustrated in FIG. 3. Based on the control pulse pREF, the TDC acquires, as a digital signal, a signal indicating an input timing of a signal output from each pixel via the waveform shaping unit 210, as a relative time.

Figure 5A:
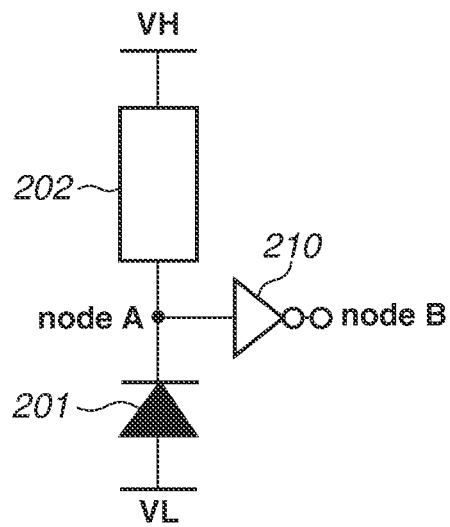
FIGS. 5A, 5B, and 5C are schematic diagrams illustrating the driving of a pixel circuit of a photoelectric conversion apparatus that can be used together with a processing apparatus according to an embodiment.
Figure 5B:
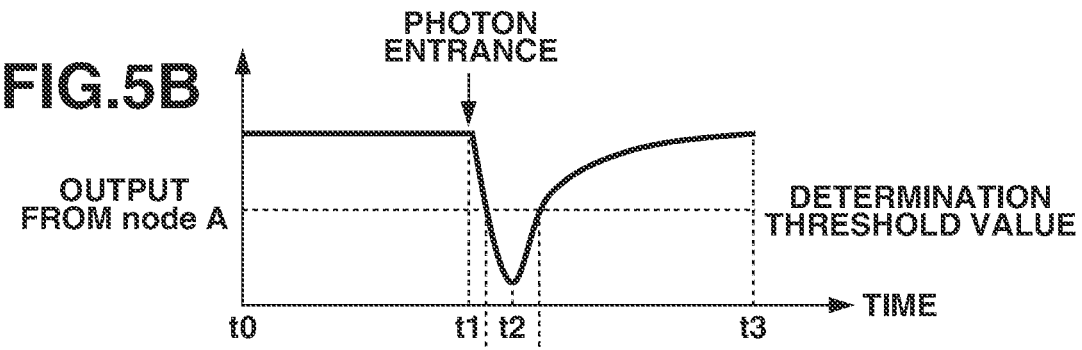
Figure 5C:
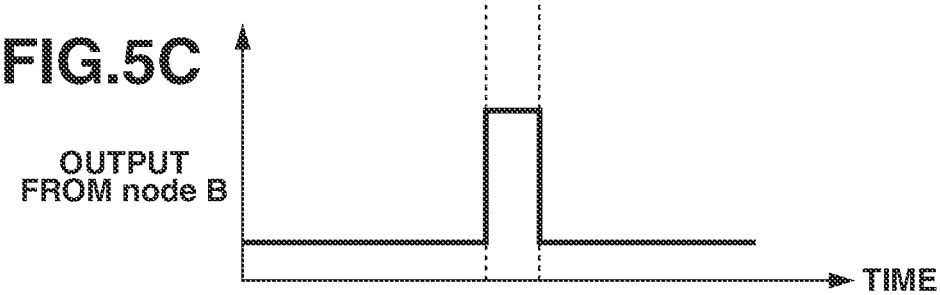

FIGS. 5A, 5B, and 5C are diagrams schematically illustrating a relationship between an operation of an APD and an output signal.

FIG. 5A is a diagram extracting the APD 201, the quench element 202, and the waveform shaping unit 210 that are illustrated in FIG. 4. In FIG. 5A, an input side of the waveform shaping unit 210 is regarded as a node A and an output side is regarded as a node B. FIG. 5B illustrates a waveform change of the node A in FIG. 5A, and FIG. 5C illustrates a waveform change of the node B in FIG. 5A.

During a period from a time t0 to a time t1, a potential difference VH-VL is applied to the APD 201 illustrated in FIG. 5A. If a photon enters the APD 201 at the time t1, avalanche multiplication occurs in the APD 201, an avalanche multiplication current flows to the quench element 202, and a voltage at the node A drops. If a voltage drop amount further increases, and a potential difference applied to the APD 201 becomes smaller, avalanche multiplication of the APD 201 stops at a time t2, and a voltage level at the node A stops dropping from a certain fixed value. After that, during a period from the time t2 to a time t3, a current compensating for a voltage drop from the voltage VL flows to the node A, and the potential level of the node A is statically settled at the original potential level at the time t3. At this time, a portion with an output waveform exceeding a certain threshold value at the node A is subjected to waveform shaping performed by the waveform shaping unit 210, and output as a signal at the node B.

The arrangement of the signal lines 113, and the arrangement of the readout circuit 112 and the output circuit 114 are not limited to that illustrated in FIG. 3. For example, the signal lines 113 can be arranged with extending in a row direction, and the readout circuit 112 can be arranged at the ends of the extending signal lines 113.

Hereinafter, a photoelectric conversion apparatus of each embodiment will be described.

A processing apparatus according to a first embodiment will be described with reference to FIGS. 6 to 10.

FIG. 6 is an explanatory diagram of a comparative example of the first embodiment.

As a general flaw correction unit, there has been known a method of extracting a pixel with an output level higher than those of surrounding pixels, as a flaw pixel, and replacing an output of the flaw pixel with an average value or a median value of outputs of the surrounding pixels.

For example, in a case where pixels are APDs, a plurality of flaw pixels is generated in some cases, due to a crosstalk attributed to an avalanche luminescent phenomenon caused when charges subjected to avalanche multiplication are recoupled. Such flaws will be referred to as a cluster flaw. The case where a cluster flaw is generated due to a crosstalk is not limited to the case where pixels are APDs, and a cluster flaw can be generated also in a complementary metal-oxide semiconductor (CMOS) sensor.

FIG. 6(a) schematically illustrates a cluster flaw before correction. It is indicated that, the whiter a pixel is, the higher an output value is. In FIG. 6(a), the influence of the center flaw pixel reaches, in addition to a center flaw pixel, two pixels of above and below positions of the flaw pixel, two pixels of left right positions of the flaw pixel, and four pixels arranged diagonally to the center flaw pixel. A method of replacing outputs of pixels having such a cluster flaw, with an average value of outputs of surrounding pixels is applied. FIG. 6(b) illustrates this correction unit. The correction unit replaces an output of a center flaw pixel with an average value of outputs of left and right pixels. Nevertheless, if this correction unit is applied to the example illustrated in FIG. 6(a), a residual flaw remains as illustrated in FIG. 6(c), and correction accuracy deteriorates. Thus, there has been such an issue that the quality of an image obtained after flaw correction deteriorates, if the correction unit of the comparative example is used.

Figure 7:
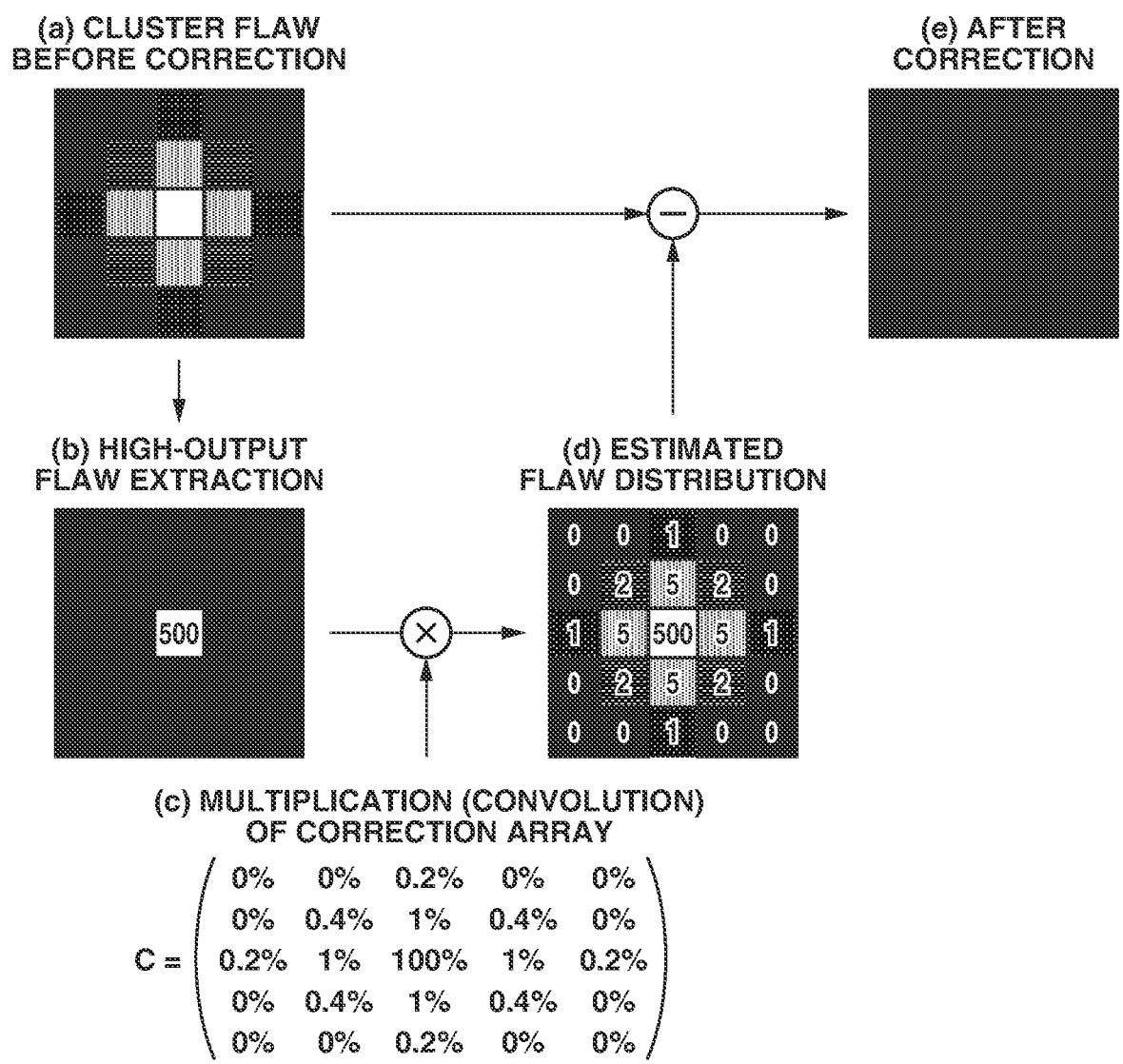
FIG. 7 is an explanatory diagram of a processing apparatus according to the first embodiment.

FIG. 7 is an explanatory diagram of the first embodiment. In the present embodiment, a pixel with an output level higher than surrounding pixels is first extracted from an image (FIG. 7(a)) in which a cluster flaw is generated, as a flaw pixel (FIG. 7(b)). At this time, zero least significant bit (OLSB) is set as outputs of surrounding pixels other than the pixel extracted as a flaw pixel. By multiplying the obtained flaw pixel by a correction array obtained in advance (FIG. 7(C)), an estimated flaw distribution is obtained (FIG. 7(d)). The correction array indicates the influence of one flaw pixel that is effected on surrounding pixels, as a matrix of crosstalk probabilities (crosstalk matrix). The multiplication includes calculation of multiplying each component of the crosstalk matrix by a constant using a numerical value that is based on a flaw pixel output, and a convolution operation that uses fast Fourier transformation (FFT), for example. By the processing, a flaw distribution of a cluster flaw can be estimated from the extracted flaw pixel. By performing correction of a cluster flaw using the obtained estimated flaw distribution, it is possible to perform highly-accurate flaw correction without leaving a residual flaw.

Figure 8:
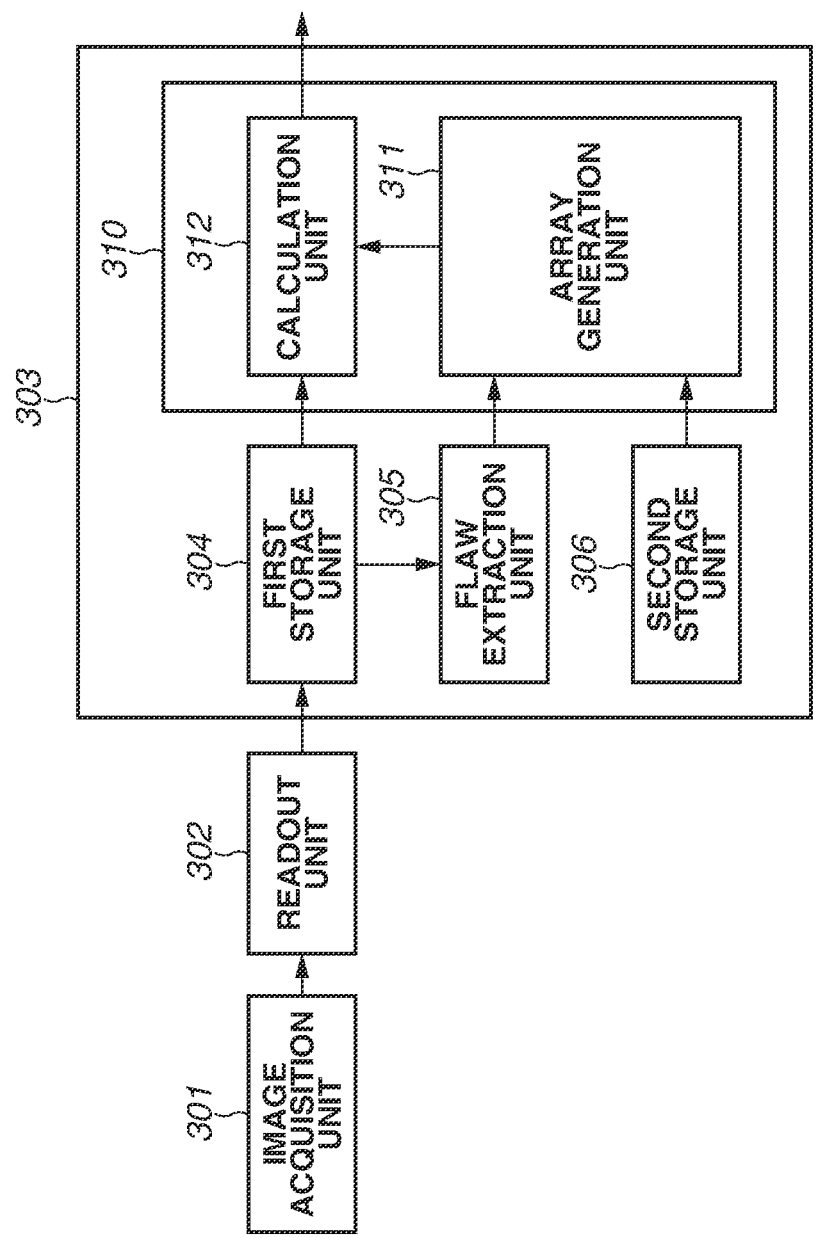
FIG. 8 is a block diagram of the processing apparatus according to the first embodiment.

FIG. 8 is a block diagram of a processing apparatus according to the first embodiment.

The processing apparatus according to the first embodiment includes an image acquisition unit 301, a readout unit 302, and an image processing unit 303. The image processing unit 303 includes a first storage unit 304, a flaw extraction unit 305, a second storage unit 306, and a correction unit 310. The correction unit 310 includes an array generation unit 311 and a calculation unit 312.

The image acquisition unit 301 corresponds to, for example, the pixel 101 in the pixel region 12 illustrated in FIG. 2, and the readout unit 302 corresponds to, for example, the signal processing unit 103 in illustrated FIG. 3. Image data generated by the image acquisition unit 301 is input to the first storage unit 304.

The first storage unit 304 stores at least a part of image data generated by a preceding unit, as first array data. Specifically, the first array data is stored using a memory, such as a static random access memory (SRAM), as a storage unit.

The flaw extraction unit 305 extracts an output value of a flaw pixel from image data stored in the first storage unit 304, as fifth array data, and identifies position information and an output value of the flaw pixel.

The second storage unit 306 stores second array data for correction. That is, the second array data for correction is a crosstalk matrix.

The array generation unit 311 generates third array data being correction calculation data, based on the position and the output value of the flaw pixel that have been extracted by the flaw extraction unit 305, and the second array data for correction that is stored in the second storage unit 306.

The calculation unit 312 performs correction of image data based on the third array data generated by the array generation unit 311.

Figure 9:
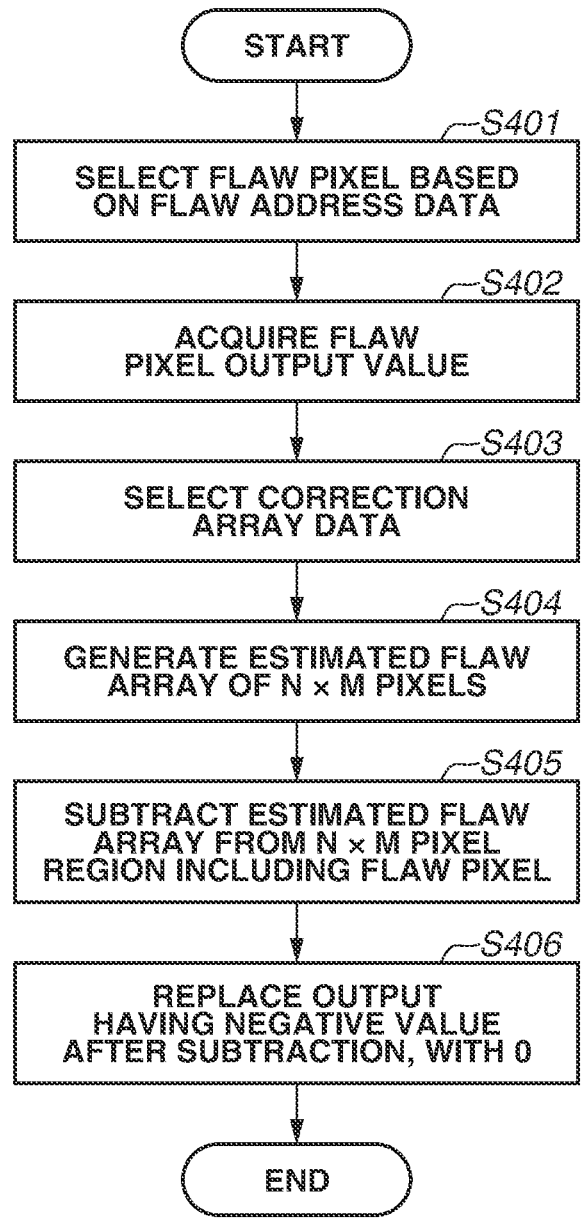
FIG. 9 is a flowchart illustrating processing to be executed by the processing apparatus according to the first embodiment.

FIG. 9 is a flowchart illustrating processing to be executed by the processing apparatus according to the first embodiment.

In step S401, the flaw extraction unit 305 selects a flaw pixel based on flaw address data from image data acquired by the image acquisition unit 301. The flaw address data is assumed to be position information of the flaw pixel that has been acquired in advance.

In step S402, an output value of the flaw pixel selected in step S401 is acquired.

In step S403, the second storage unit 306 selects correction array data. The correction array data includes N rows and M columns. The second storage unit 306 can store a plurality of types of correction array data, which will be described in detail below.

In step S404, an estimated flaw array of N×M pixels is generated.

In step S405, processing is performed of subtracting the estimated flaw array from image data of the N×M pixel region including the flaw pixel.

In step S406, an output value having a negative value after the subtraction in step S405 is replaced with 0, and the processing ends.

The correction array data can be one-dimensional data or two-dimensional data as long as the correction array data includes two or more pieces of data. In other words, it is sufficient that one of N and M is an integer larger than or equal to 2, and the other one is an integer larger than or equal to 1. It is desirable that the correction array data includes three or more pieces of data, and both of N and M are integers larger than or equal to 3. In other words, it is desirable that the correction array data has a size larger than or equal to three rows and three columns, and pixel data to be corrected also has a size larger than or equal to three rows and three columns. This is because, in the present embodiment, correction can be performed accurately in a case where pixels exist around a flaw pixel. Furthermore, it is desirable that N and M are odd numbers in consideration of the symmetry of crosstalk probabilities.

In the present embodiment, a flaw pixel is detected using address data acquired in advance, but a flaw extraction method is not limited to this. Because a cluster flaw typically has a cross shape, a square shape, or a circular shape, an output value of a flaw pixel can be detected by, for example, pattern matching.

Furthermore, in the above description, correction is performed by subtracting estimated flaw array data from image data including a flaw, but correction processing can be processing other than subtraction. For example, correction can be performed by dividing image data including a flaw by a generated flaw array. Alternatively, in a case where inverses of probabilities of the influences of one flaw pixel that are effected on surrounding pixels are used as a correction array, multiplication of image data including a flaw and estimated flaw array data can be performed. In this case, a bottom value is allocated to a position (center) in a correction array that corresponds to the flaw pixel.

Figure 10:
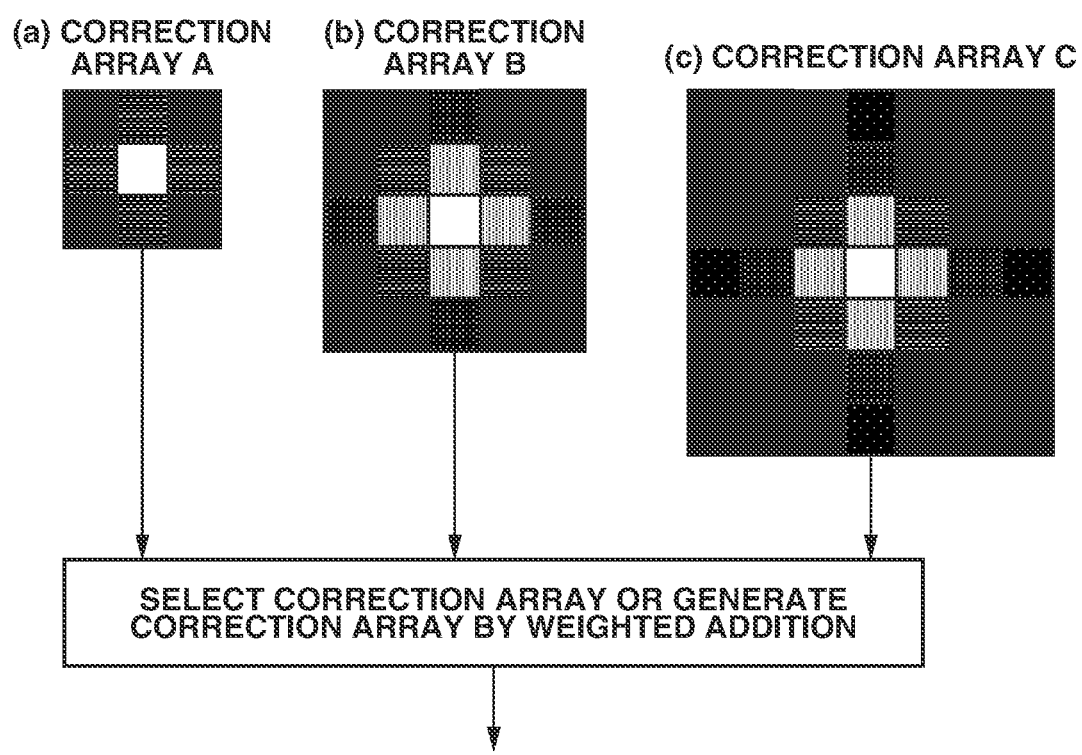
FIG. 10 is an explanatory diagram of correction arrays of the processing apparatus according to the first embodiment.

FIG. 10 is an explanatory diagram of a correction array of the processing apparatus according to the first embodiment.

As described above, correction array data is selected in step S403 of FIG. 9. The second storage unit 306 stores three types of correction arrays corresponding to correction arrays A to C, for example. FIG. 10(*a*) is a schematic diagram of a cluster flaw corresponding to the correction array A, FIG. 10(*b*) is a schematic diagram of a cluster flaw corresponding to the correction array B, and FIG. 10(*c*) is a schematic diagram of a cluster flaw corresponding to the correction array C.

The correction array A is a correction array including three rows and three columns that is to be used in a case where a flaw pixel affects four pixels arranged on the above, below, left, and right of the flaw pixel.

The correction array B is a correction array including five rows and five columns that is to be used in a case where a flaw pixel affects 12 pixels in total that include two pixels above the flaw pixel, two pixels below the flaw pixel, two pixels on the left of the flaw pixel, and two pixels on the right of the flaw pixel, and four pixels arranged diagonally to the flaw pixel.

Similarly, the correction array C includes seven rows and seven columns that is to be used in a case where a flaw pixel affects 16 pixels that include three pixels above the flaw pixel, three pixels below the flaw pixel, three pixels on the left of the flaw pixel, and three pixels on the right of the flaw pixel, and four pixels arranged diagonally to the flaw pixel. Because light attributed to a crosstalk tends to travel in a side-opposing direction of pixels, the influence of the flaw pixel is considered in a wider region in the above-below and the left-right directions than diagonal directions of the flaw pixel.

In step S403, one correction array is generated by selecting any one correction array from these correction arrays, or by performing weighted addition of these correction arrays. A correction array can be selected in accordance with an image capturing environment, a temperature measurement result of a sensor that generates image data, a condition of a voltage to be applied to the image acquisition unit and the processing apparatus, and a drive condition of the image acquisition unit and the processing apparatus. In a case where different pixel layouts exist, a correction array can be selected in accordance with a pattern of a pixel layout. In addition, a correction array can be selected in accordance with an arrangement point in a pixel array of a pixel to be corrected. Specifically, in a case where a targeted pixel exists at the end of the pixel array, array data with a small size can be used because the number of surrounding pixels in which a crosstalk occurs is small.

If one row or one column of a correction array being two-dimensional array data is extracted as one-dimensional data, the one-dimensional data has a peak value at the center. The one-dimensional data also has a distribution monotonously changing from the data center corresponding to the peak value, toward data ends being both ends of the one-dimensional data. Furthermore, one-dimensional data pieces in a row direction and a column direction that share a data center having a peak value of data, and are arrayed in intersecting directions have a distribution monotonously changing from the data center toward data ends both in the row direction and the column direction.

When adjacent two pixels (pixel A, pixel B) both output a peak value, for example, the pixels A and B each have a correction array having a data distribution centered on a corresponding pixel. In such arrangement, due to the influence of shot noise or a quantization error, excessive correction processing is sometimes performed on pixels existing near both of the pixels A and B. Nevertheless, image quality is not deteriorated by the processing because a pixel output having a negative value after the correction processing due to the excessive correction processing is replaced with 0 as illustrated in step S406 of FIG. 9. In the present embodiment, an example of replacing a pixel output with 0 has been described. Alternatively, a pixel output can be replaced with an average value or a median value of output values of pixels surrounding a flaw pixel, or can be replaced with a predetermined nonnegative constant.

Even in a case where one flaw pixel is surrounded by non-flaw pixels, outputs of surrounding pixels affected by the flaw pixel vary due to shot noise, and an output obtained after correction processing stochastically becomes a negative value in some cases. Also in such cases, a pixel output obtained after correction is replaced with 0. Thus, image quality deterioration attributed to overcorrection can be prevented.

The above description has been mainly given of a case where a correction array has a peak value at the center. Also in a case where a correction array has a bottom value at the center, the correction array similarly has a distribution monotonously changing from the data center toward data ends.

A correction array can be generated based on a pattern of a flaw pixel in an optical black (OB) region in which a light incidence surface side of the pixel region 12 serving as an image acquisition unit is shielded by a light shielding film, for example. Alternatively, a correction array can be generated by pattern learning that is based on machine learning or deep learning using acquired image data pieces.

A processing apparatus according to a second embodiment will now be described with reference to FIGS. 11 and 12. A difference from the first embodiment will be mainly described, and the description of parts similar to those in the first embodiment will be omitted.

Figure 11:
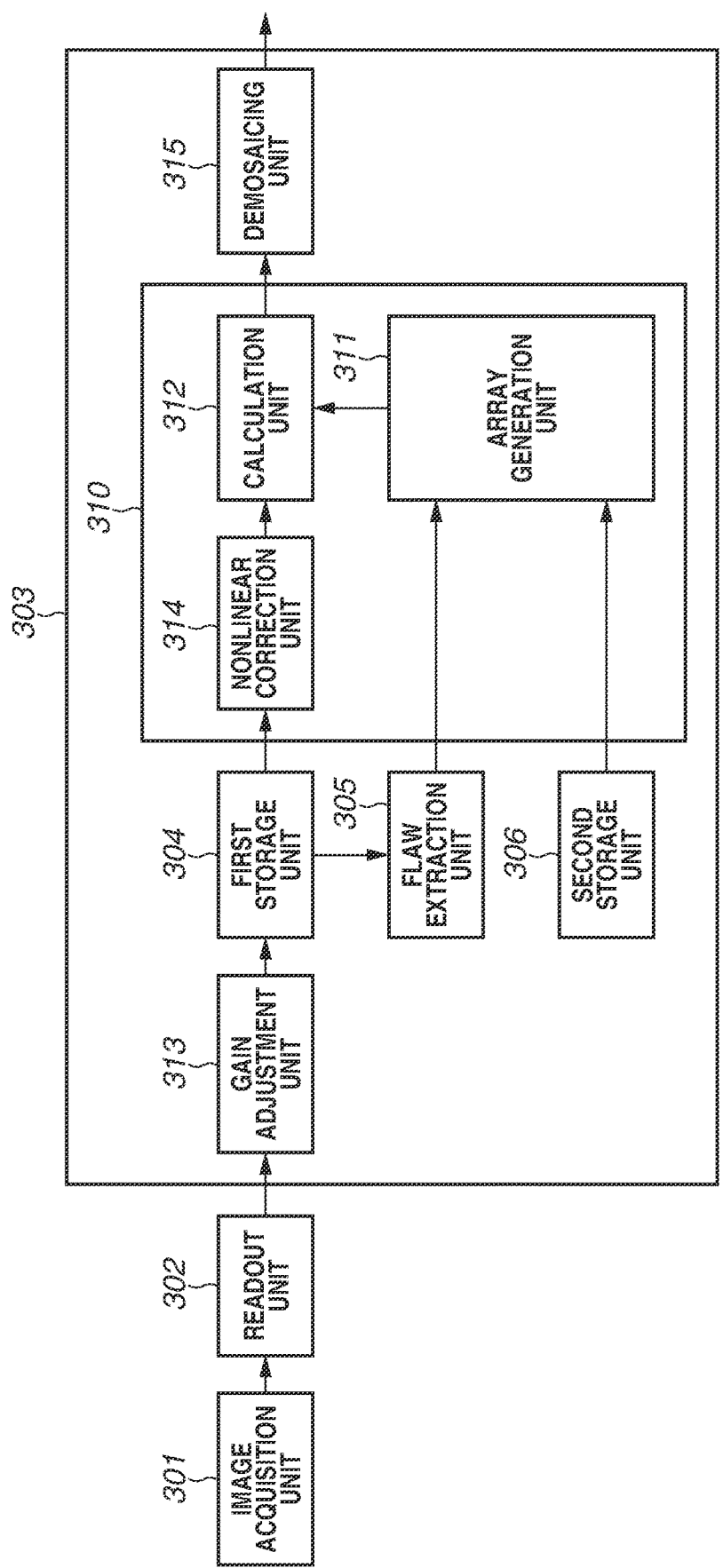
FIG. 11 is a block diagram of a processing apparatus according to a second embodiment.

FIG. 11 is a block diagram illustrating the processing apparatus according to the second embodiment.

The processing apparatus according to the second embodiment includes an image acquisition unit 301, a readout unit 302, and an image processing unit 303. The image processing unit 303 includes a gain adjustment unit 313 and a demosaicing unit 315. The correction unit 310 includes a nonlinear correction unit 314.

The gain adjustment unit 313 is provided between the image acquisition unit 301 (readout unit 302) and the first storage unit 304, and applies a digital gain to image data generated by the image acquisition unit 301. Correction array data that is based on a crosstalk probability and stored in the second storage unit 306 often includes a fractional value. In a case where an output of an image is an integer, correction accuracy might be deteriorated by a quantization error if an array generated by the array generation unit 311 is of an integer type. By preliminarily applying a gain to image data, it is possible to suppress the influence of a quantization error and improve correction accuracy. If a quantization error can be reduced to ¼ or less of a single-photon signal level, a corrected image becomes visually natural. Thus, a digital gain to be applied to image data is desirably four or more, for example.

The nonlinear correction unit 314 is arranged between the first storage unit 304 and the calculation unit 312, and corrects image data. In a case where the image acquisition unit 301 is a photon counting detector, an optical response often becomes nonlinear due to the influence of a dead time. A luminescent crosstalk increases a signal level while being superimposed on optical signals to be received by surrounding pixels, but in a case where the influence of a nonlinear optical response is received, overcorrection is sometimes caused if correction is performed on the assumption of a nonlinear response. Thus, overcorrection can be prevented by performing nonlinear correction of image data before calculation processing executed by the calculation unit 312.

The nonlinear correction is performed using a look up table, for example.

The demosaicing unit 315 is provided as a subsequent unit of the calculation unit 312. In a case where the image acquisition unit 301 is an apparatus that can acquire color images, it is necessary to perform demosaicing processing of complementing a signal acquired by the image acquisition unit 301, with reference to color information of neighboring pixels. A crosstalk occurs irrespective of a color array of pixels, and thus it is desirable to execute correction of a crosstalk before demosaicing processing. In a case where the image acquisition unit 301 is an apparatus that can acquire color images, the flaw extraction unit 305 desirably performs flaw determination by comparing an output of a pixel of interest and an output of a neighboring pixel having the same color as the pixel of interest.

Figure 12:
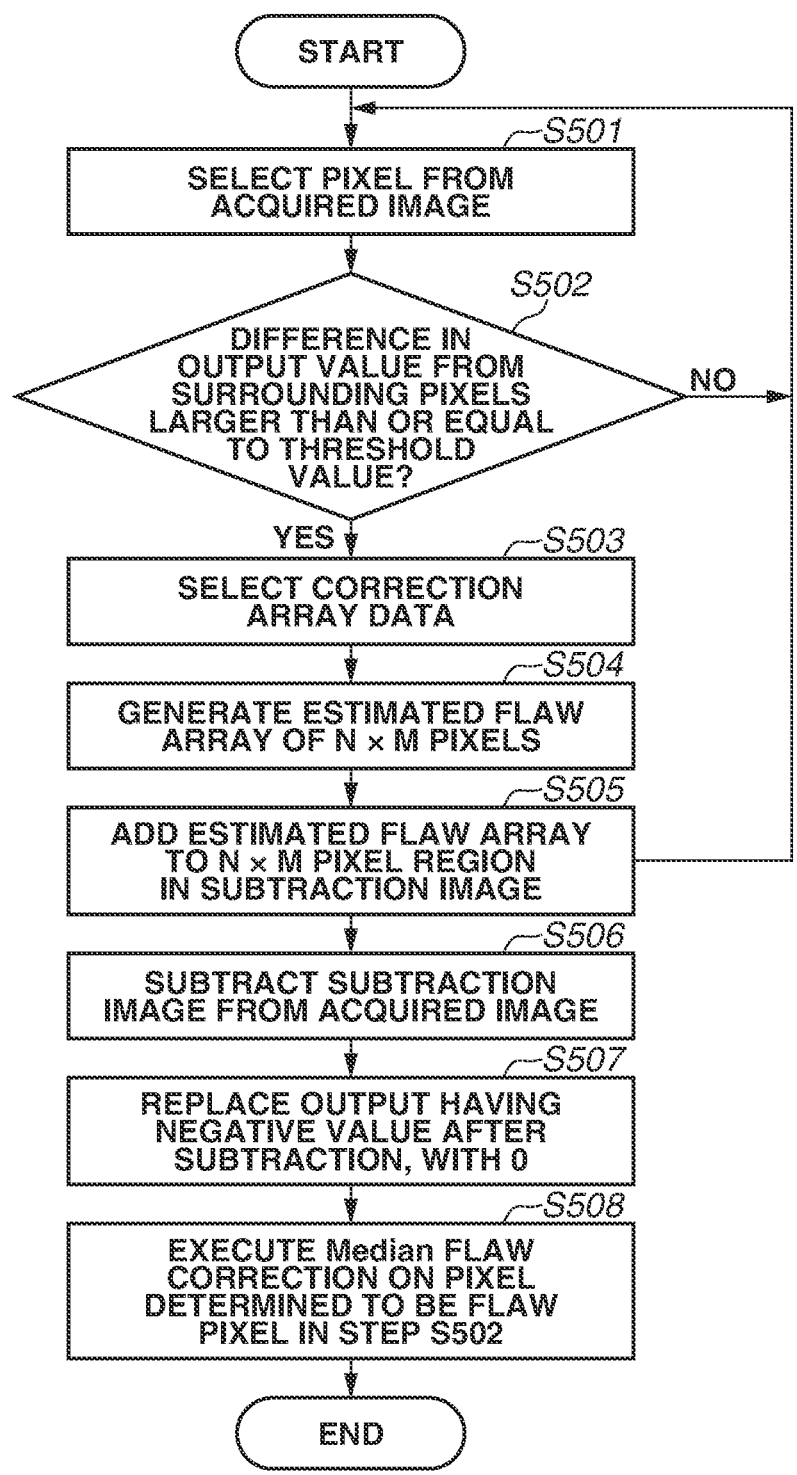
FIG. 12 is a flowchart illustrating processing to be executed by the processing apparatus according to the second embodiment.

FIG. 12 is a flowchart illustrating processing to be executed by the processing apparatus according to the second embodiment.

In step S501, a pixel is selected from image data acquired by the image acquisition unit 301.

In step S502, flaw pixel determination is performed. In this step, in a case where a difference in output value between the selected pixel and surrounding pixels is larger than or equal to a threshold value (YES in step S502), the selected pixel is determined to be a flaw pixel. If the selected pixel is not a flaw pixel (NO in step S502), the processing returns to step S501. In step S501, a pixel is selected again, and the processing in steps S501 and S502 is repeated until the selected pixel is determined to be a flaw pixel. If a difference in output value between the selected pixel and surrounding pixels is larger than or equal to a threshold value (YES in step S502), the selected pixel is determined to be a flaw pixel, and the processing proceeds to step S503. In step S503, correction array data is selected.

In step S504, an estimated flaw array of N×M pixels is generated.

In step S505, the estimated flaw array is added to an N×M pixel region in a subtraction image.

In step S506, the subtraction image is subtracted from image data.

In step S507, an output value having a negative value after the subtraction in step S506 is replaced with 0.

In step S508, Median correction is executed on the pixel determined to be a flaw pixel in step S502, and the processing ends.

A pseudo signal level in surrounding pixels of a flaw pixel is relatively low within a cluster flaw in many cases, and thus it is possible to accurately correct flaws by subtraction. In contrast, a flaw pixel existing at the center of a cluster flaw has a relatively-high output, an error is likely to occur at the time of correction due to the influence of shot noise. Correction accuracy can be improved by initially correcting outputs of surrounding pixels by subtraction, and then correcting an output of a flaw pixel based on the corrected outputs of the surrounding pixels.

In the present embodiment, correction accuracy as the entire image is improved by correcting outputs of surrounding pixels of a flaw pixel by subtraction, and then replacing an output of the flaw pixel with an average value or a median value of the corrected outputs of the surrounding pixels. An offset of dark current components can be subtracted by adding offset output that is based on an output of an OB region, to the subtraction image, or by reflecting an output distribution that considers shading of a dark output.

In the present embodiment, a selected pixel is determined to be a flaw pixel in a case where a difference in output value between the selected pixel and surrounding pixels is larger than or equal to a threshold value. The surrounding pixels refer to pixels adjacent to the selected pixel, for example. In other words, a first pixel or a second pixel is determined to be a flaw pixel in a case where an output difference between an output value of the first pixel and an output value of the second pixel adjacent to the first pixel is larger than or equal to a fixed threshold value. In this case, flaw correction can be performed without storing flaw address data, and thus a storage capacity can be reduced and a system can be downsized.

In the present embodiment, correction is performed by subtracting a subtraction image generated by adding estimated flaw array data, from image data including a flaw, without directly subtracting estimated flaw array data from image data including a flaw. In a case where flaw correction is performed by one pixel by one pixel, pixels receiving crosstalk influences of a plurality of flaw pixels undergo subtraction processing a plurality of times. Depending on the method used in correction processing, a quantization error is generated each time subtraction processing is executed, and flaw correction accuracy deteriorates. As described in the present embodiment, it is possible to reduce a quantization error and improve the accuracy of flaw correction by sequentially adding estimated flaw arrays for correction to a subtraction image. As described above, correction of outputs of surrounding pixels of a flaw pixel can be correction processing that uses calculation, such as division or multiplication, other than subtraction. In this case, it is also possible to prevent correction accuracy deterioration caused by a quantization error.

Figure 13:
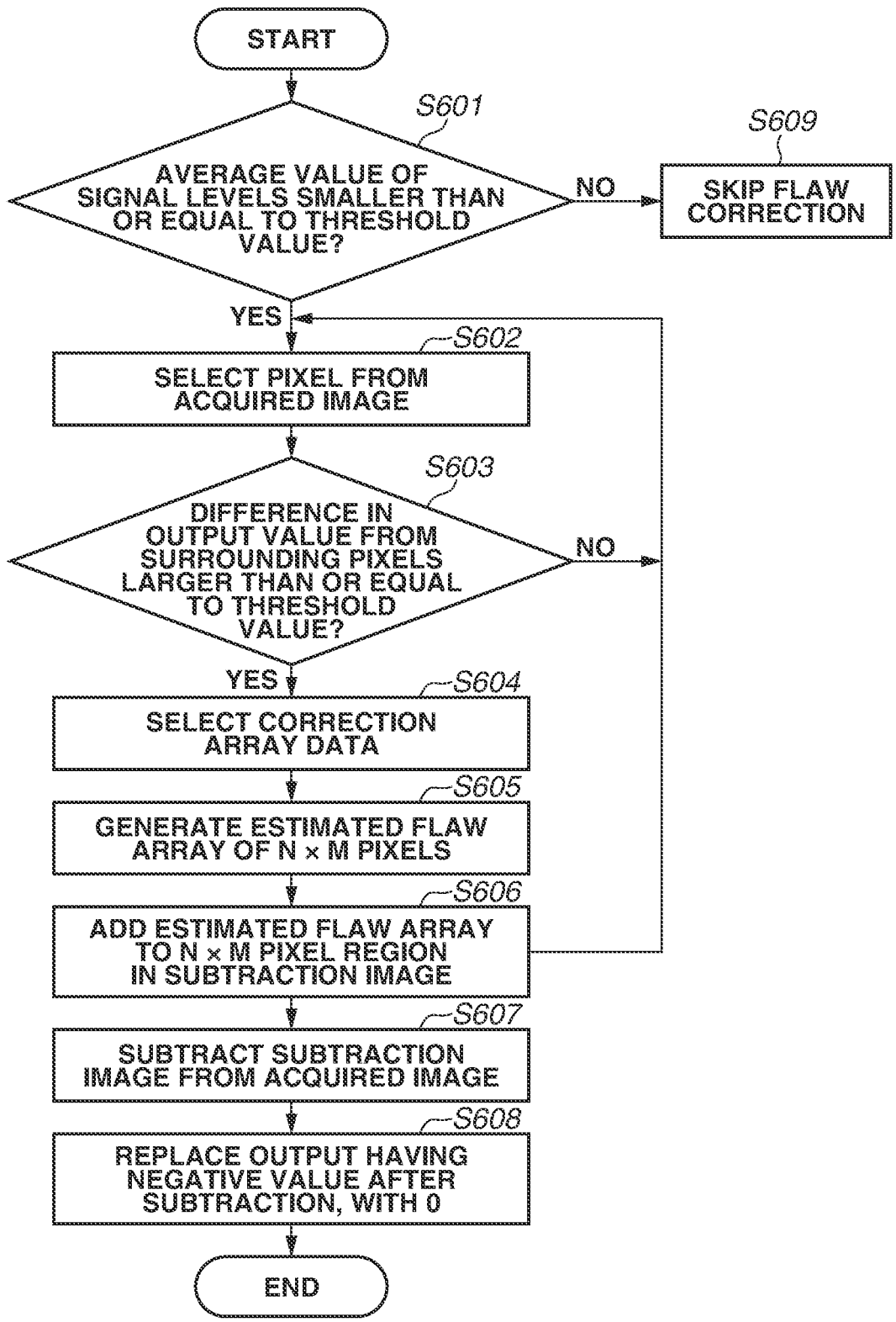
FIG. 13 is a flowchart illustrating processing to be executed by a processing apparatus according to a third embodiment.

FIG. 13 is a flowchart illustrating processing to be executed by a processing apparatus according to a third embodiment. In the present embodiment, whether to execute flaw correction can be switched depending on an image capturing scene.

In step S601, an average value of signal levels of image data acquired by an image acquisition unit is compared with a threshold value. If the average value of signal levels is not smaller than or equal to the threshold value (NO in step S601), the processing proceeds to step S609. In step S609, the flaw correction processing is stopped.

This is because a skirt portion of a cluster flaw is less noticeable in a scene in which the average value of signal levels is not smaller than or equal to the threshold value (i.e., a signal level is high), and adequate correction can be performed by a normal flaw correction algorithm.

In a case where an average value of signal levels is smaller than or equal to the threshold value (i.e., in a low-illuminance environment) (YES in step S601), it is desirable to perform cluster flaw correction. In this case, the processing proceeds to step S602 where a pixel is selected from an acquired image.

In step S603, flaw pixel determination is performed. If a difference in output value between the selected pixel and surrounding pixels is larger than or equal to a threshold value (YES in step S603), the selected pixel is determined to be a flaw pixel. If a difference in output value between the selected pixel and surrounding pixels is not larger than or equal to a threshold value (NO in step S603), the processing returns to step S602. In step S602, a pixel is selected again, and the operation in steps S602 and S603 is repeated until the selected pixel is determined to be a flaw pixel. If a ratio between output values of the acquired pixel and surrounding pixels is larger than or equal to a threshold value (YES in step S603), the processing proceeds to step S604. In step S604, correction array data is selected.

In step S605, an estimated flaw array of N×M pixels is generated.

In step S606, the estimated flaw array is added to a region in a subtraction image that corresponds to the N×M pixels.

The subtraction image can be generated by repeating the operations in steps S602 to S606.

In step S607, the subtraction image is subtracted from the image data.

In step S608, an output value having a negative value after the subtraction is replaced with 0, and the processing ends.

Based on the above-described flow in the present embodiment, typical flaw correction is performed in a high-illuminance environment in which a skirt portion of a cluster flaw is less noticeable, and cluster flaw correction is performed in a low-illuminance environment in which a cluster flaw is noticeable. By switching whether or not to execute flaw correction depending on an image capturing scene in this manner, it is possible to achieve both of higher accuracy of flaw correction and shortening of a processing time.

Figure 14:
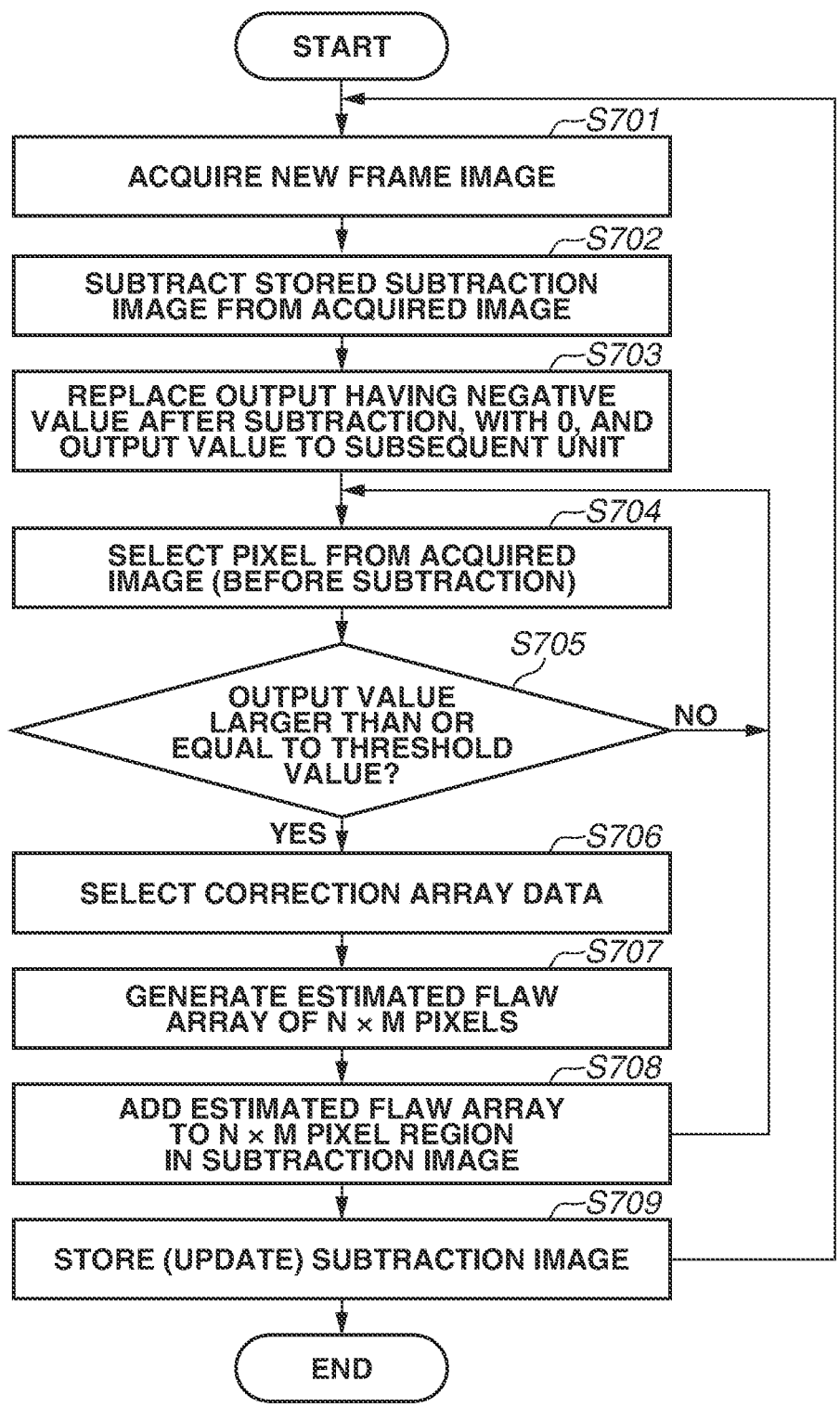
FIG. 14 is a flowchart illustrating processing to be executed by a processing apparatus according to a fourth embodiment.

FIG. 14 is a flowchart illustrating processing to be executed by a processing apparatus according to a fourth embodiment. In the present embodiment, more accurate flaw correction is enabled by updating flaw information for each frame group including a plurality of frames.

In step S701, a new frame image acquired by an image acquisition unit is acquired.

In step S702, a stored subtraction image is subtracted from the image acquired in step S701.

In step S703, an output value having a negative value after the subtraction is replaced with 0, and the result is output to a subsequent unit. Cluster flaw correction processing on the new frame image acquired in step S701 is completed by the processing performed in steps up to step S703. The subsequent processing is update processing of a subtraction image for executing cluster flaw correction processing on an image of the next frame.

In step S704, a pixel is selected from image data obtained before the subtraction is performed in step S703.

In step S705, flaw pixel determination is performed. If an output value of the selected pixel is larger than or equal to a threshold value (YES in step S705), the selected pixel is determined to be a flaw pixel. If the output value of the selected pixel is not larger than or equal to the threshold value (NO in step S705), the processing returns to step S704. In step S704, a pixel is selected again, and the operation in steps S704 and S705 is repeated until the selected pixel is determined to be a flaw pixel. If the output value of the selected pixel is larger than or equal to the threshold value (YES in step S705), the processing proceeds to step S706. In step S706, correction array data is selected.

In step S707, an estimated flaw array of N×M pixels is generated.

In step S708, the estimated flaw array is added to a region in a subtraction image that corresponds to the N×M pixels.

The subtraction image can be generated by repeating the operations in steps S704 to S708.

In step S709, the subtraction image is stored.

According to the present embodiment, speed-up of correction processing can be achieved, for example, by using flaw address data acquired in a certain frame, for correction of image data to be acquired in the next frame. The speed-up of correction processing can also be achieved by extracting a flaw address once every plural frames, and using the obtained flaw address data for correction of image data obtained in each frame, until a flaw address is extracted next.

In other words, correction of image data in a second frame acquired later than the first frame can be performed based on address data or an output value of a flaw pixel that has been extracted from image data in a first frame.

Figure 15:
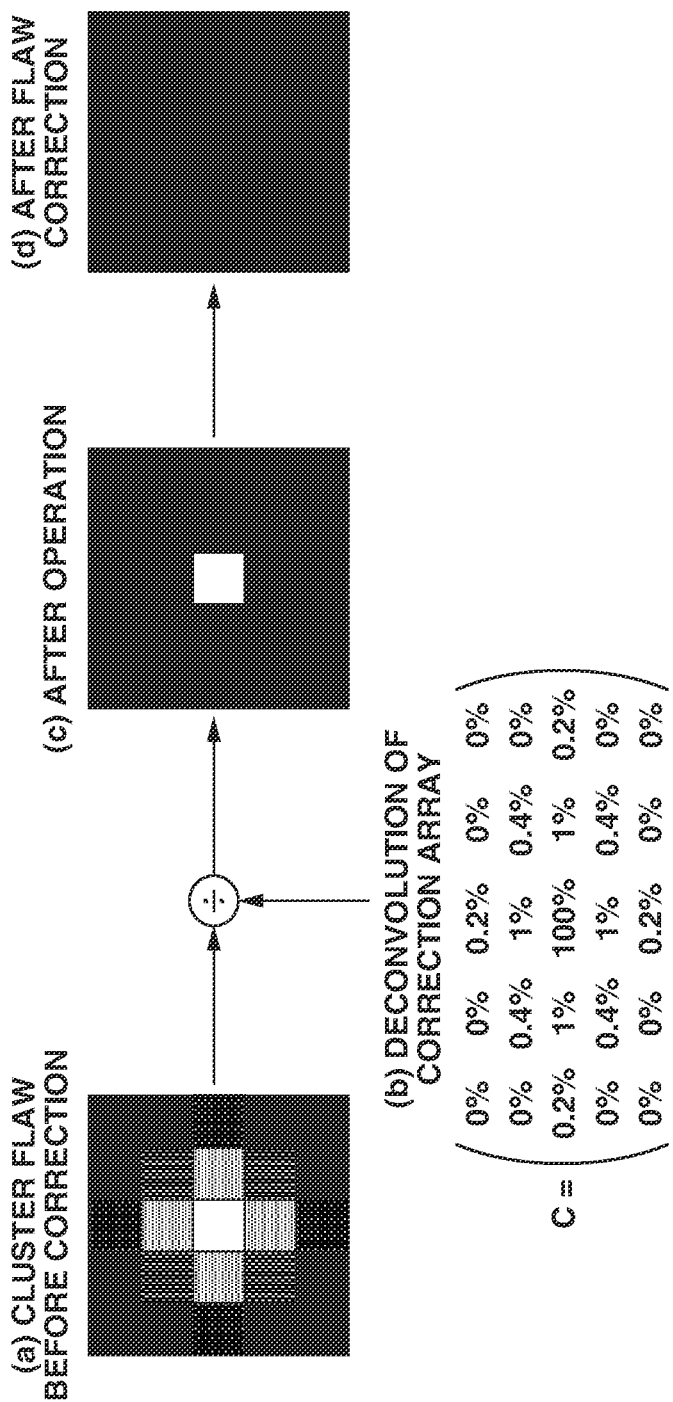
FIG. 15 is an explanatory diagram of a processing apparatus according to a fifth embodiment.

A fifth embodiment will be described with reference to FIGS. 15 to 17.

In the present embodiment, as for an image in which a cluster flaw is generated (FIG. 15(a)), division is performed using a correction array acquired in advance (FIG. 15(b)). The division is a deconvolution operation, for example. Flaw correction is performed on the pixels obtained after calculation (FIG. 15(d)).

In FIG. 7, an estimated flaw distribution is acquired by extracting flaw pixels from an image in which a cluster flaw is generated, and then multiplying the extracted flaw pixels by a correction array, and the image in which the cluster flaw is generated is corrected based on the estimated flaw distribution. In contrast to this, in the present embodiment illustrated in FIG. 15, a plurality of pixels including a flaw pixel is divided by a correction array without extracting a flaw pixel. By performing such calculation, it is possible to efficiently extract flaw pixels that have caused a cluster flaw. The number of calculation processes in the present embodiment is smaller as compared with the embodiment described with reference to FIG. 7, and thus it is possible to perform highly-accurate flaw correction at high speed. Furthermore, in the present embodiment, it is possible to accurately perform flaw correction even in a case where a plurality of flaws exists proximately and skirt portions overlap.

Flaw correction to be performed on an image obtained after calculation is flaw correction of replacing an output value of a flaw pixel with an average value of output values of surrounding pixels. For example, the flaw correction method described with reference to FIG. 6 is performed. The correction array indicates the influence of one flaw pixel that is effected on surrounding pixels, as a matrix of crosstalk probabilities (crosstalk matrix).

Figure 16:
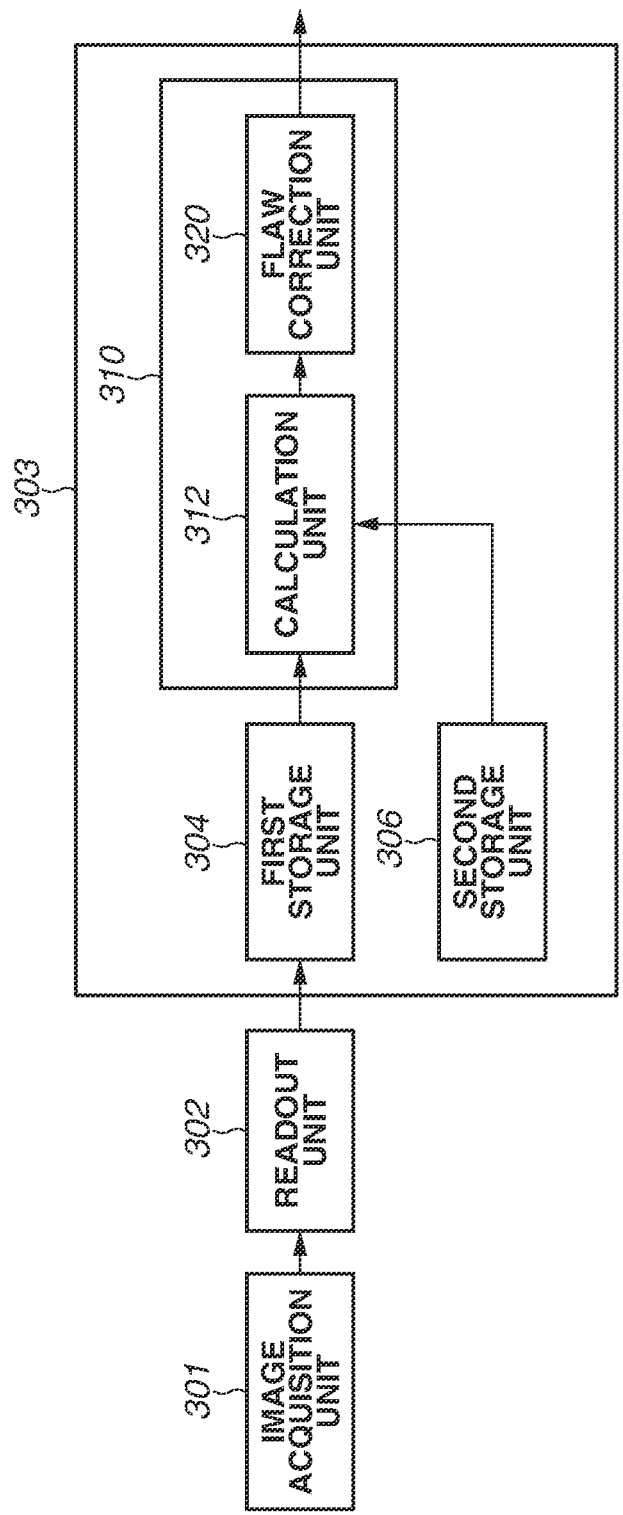
FIG. 16 is a block diagram of the processing apparatus according to the fifth embodiment.

FIG. 16 is a block diagram illustrating a processing apparatus according to the fifth embodiment.

The processing apparatus according to the fifth embodiment includes an image acquisition unit 301, a readout unit 302, and an image processing unit 303. The image processing unit 303 includes a first storage unit 304, a second storage unit 306, and a correction unit 310. The correction unit 310 includes a calculation unit 312 and a flaw correction unit 320.

The image acquisition unit 301 corresponds to, for example, the pixel 101 in the pixel region 12 illustrated in FIG. 2, and the readout unit 302 corresponds to, for example, the signal processing unit 103 illustrated in FIG. 3. Image data generated by the image acquisition unit 301 is input to the first storage unit 304.

The first storage unit 304 is used for storing at least a part of image data generated by a preceding unit, as first array data. Specifically, the first array data is stored in a memory, such as an SRAM, as a storage unit.

The second storage unit 306 stores second array data for correction. That is, the second array data for correction is a crosstalk matrix. The second storage unit 306 can store a plurality of types of correction array data.

The calculation unit 312 performs calculation on the first array data stored in the first storage unit 304, based on the second array data stored in the second storage unit 306, and obtains a calculated image as fourth array data. The calculation unit 312 can perform a deconvolution operation of the crosstalk matrix stored in the second storage unit 306, or can perform a convolution operation of a matrix (point spread function) corresponding to inverse transformation of the crosstalk matrix stored in the second storage unit 306. Through the calculation executed by the calculation unit 312, a cluster flaw in image data can be corrected to a state close to a point flaw.

The flaw correction unit 320 is a correction processing unit that performs flaw correction processing on a corrected image obtained by the calculation unit 312. The flaw correction unit 320 has a function as a flaw extraction unit that extracts a flaw pixel, and performs flaw correction processing on an output of the extracted flaw pixel.

Figure 17:
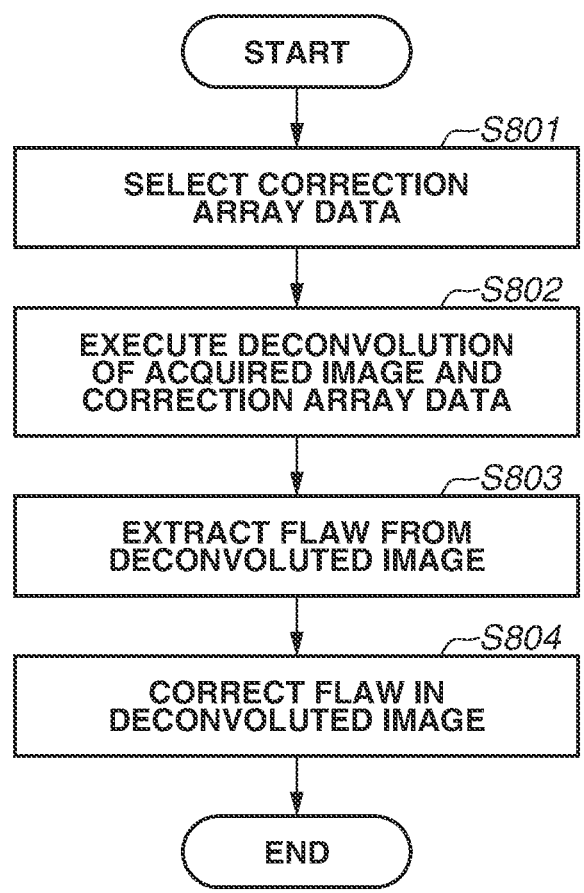
FIG. 17 is a flowchart illustrating processing to be executed by the processing apparatus according to the fifth embodiment.

FIG. 17 is a flowchart illustrating processing to be executed by the processing apparatus according to the fifth embodiment.

In step S801, correction array data is selected.

In step S802, a deconvolution operation of the correction array data selected in step S801 is performed on image data.

In step S803, a flaw is extracted from an image obtained after the deconvolution operation in step S802. The flaw extraction refers to the identification of position information or an output value of a flaw pixel in the image.

In step S804, the flaw in the image obtained after the deconvolution operation is corrected. For example, an output value of a flaw pixel extracted in step S803 is replaced with an average value of output values of surrounding pixels.

According to the processing apparatus according to the present embodiment, the correction of a cluster flaw that uses a flaw correction algorithm for a point flaw is enabled.

A sixth embodiment will now be described with reference to FIGS. 18 and 19. A difference from the fifth embodiment will be mainly described, and the description of parts similar to those in the fifth embodiment will be omitted.

Figure 18:
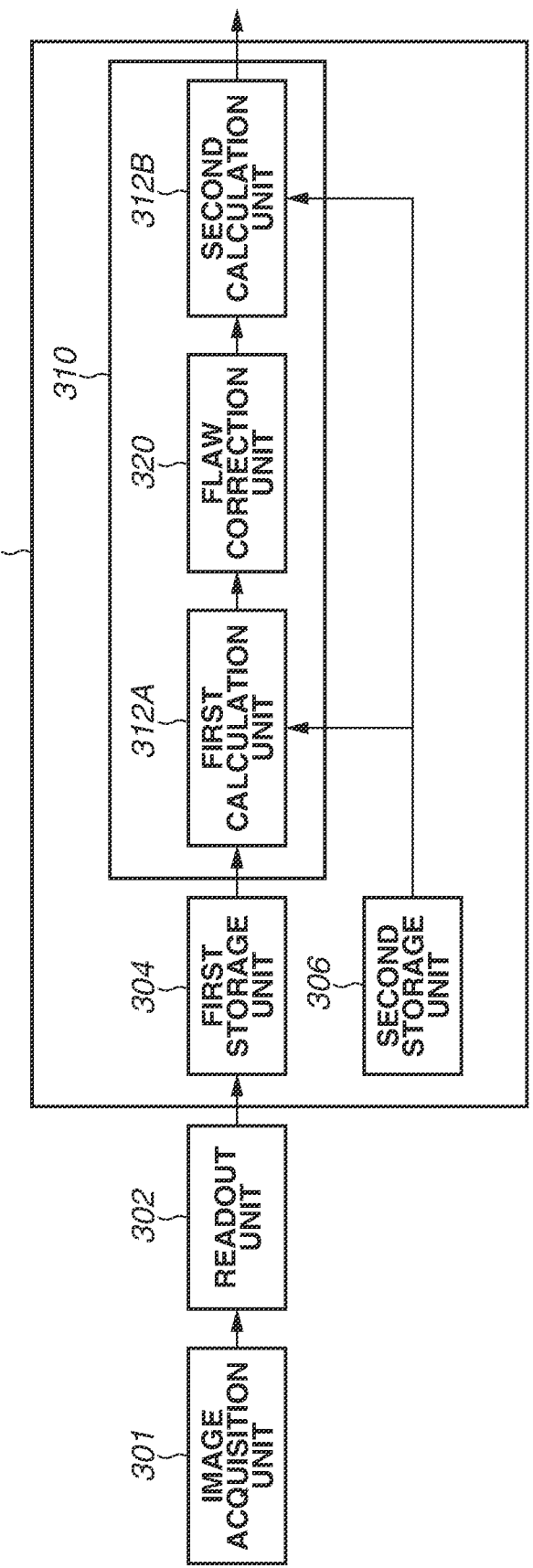
FIG. 18 is a block diagram of a processing apparatus according to a sixth embodiment.

FIG. 18 is a block diagram of a processing apparatus according to the sixth embodiment.

The processing apparatus according to the sixth embodiment includes an image acquisition unit 301, a readout unit 302, and an image processing unit 303. The correction unit 310 includes a first calculation unit 312A, a second calculation unit 312B, and a flaw correction unit 320.

The flaw correction unit 320 is provided between the first calculation unit 312A and the second calculation unit 312B. The present embodiment is characterized in that both a convolution operation and a deconvolution operation of a crosstalk matrix are performed on image data.

Figure 19:
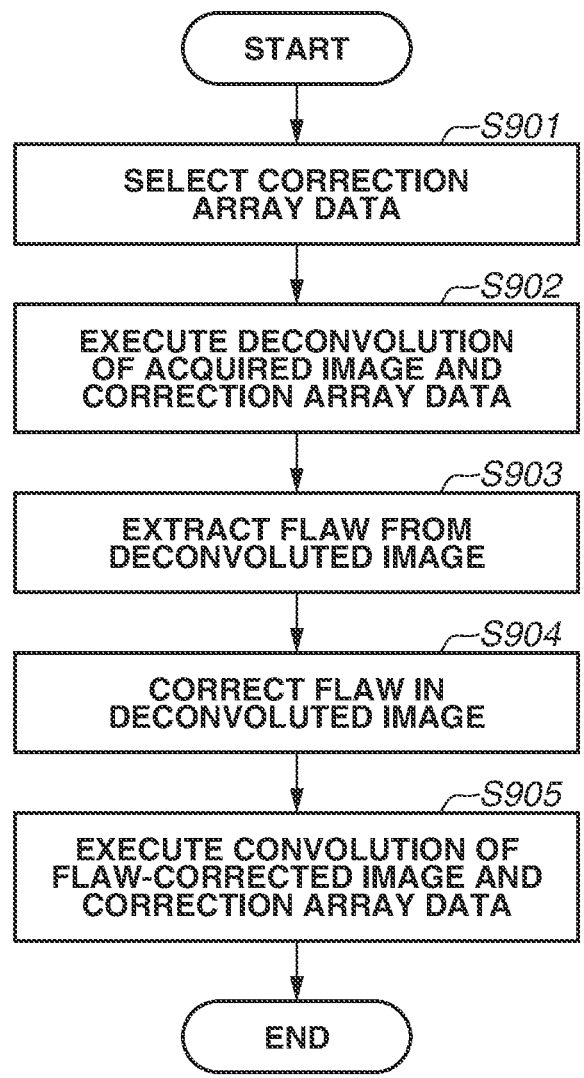
FIG. 19 is a flowchart illustrating processing to be executed by the processing apparatus according to the sixth embodiment.

FIG. 19 is a flowchart illustrating processing to be executed by the processing apparatus according to the sixth embodiment.

In step S901, correction array data is selected.

In step S902, a deconvolution operation of the correction array data selected in step S901 is performed on image data.

In step S903, a flaw is extracted from an image obtained after the deconvolution operation.

In step S904, the flaw extracted in step S903 from the image obtained after the deconvolution operation is corrected.

In step S905, a convolution operation of correction array data is performed on the flaw-corrected image.

In the fifth embodiment, random noise in a region other than a flaw pixel to be corrected is enhanced by a deconvolution operation of a crosstalk matrix, and image quality deteriorates in some cases. According to the present embodiment, it is possible to compensate for image quality deterioration by convoluting a crosstalk matrix into the flaw-corrected image data. It is therefore possible to achieve both of the improvement of flaw correction accuracy and the suppression of image quality deterioration attributed to signal processing. Similarly to the fifth embodiment, the second storage unit 306 can store a crosstalk matrix, and can also store a matrix corresponding to inverse transformation of the crosstalk matrix.

Figure 20:
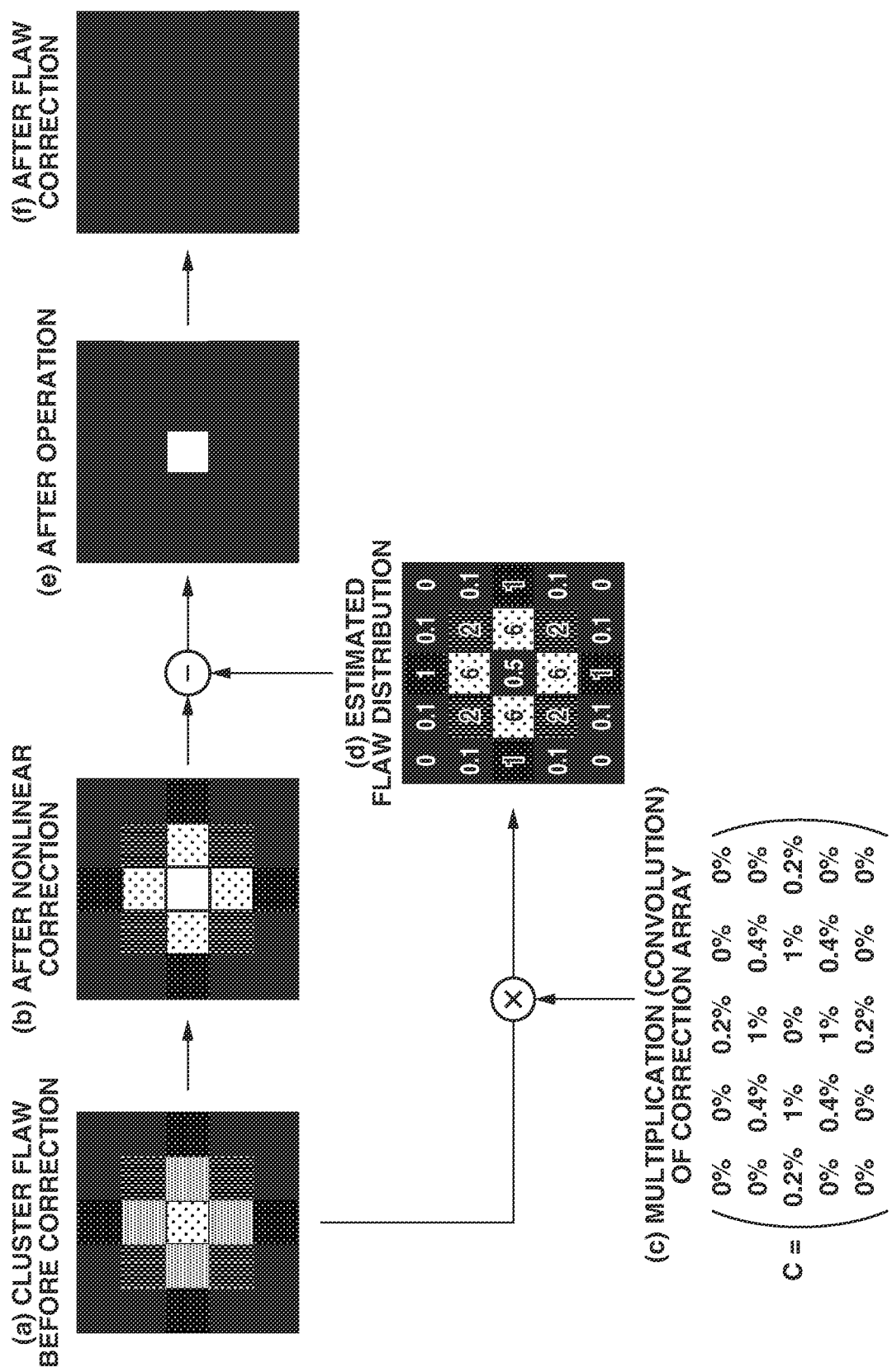
FIG. 20 is an explanatory diagram of a processing apparatus according to a seventh embodiment.

A seventh embodiment will now be described with reference to FIGS. 20 to 22. The description of parts similar to those in the first to sixth embodiments will be omitted.

In the present embodiment, as for an image in which a cluster flaw is generated (FIG. 20(a)), an estimated distribution of outputs generated by a crosstalk is acquired by multiplying the image with a correction array (FIG. 20(C)) concurrently with the execution of nonlinear correction (FIG. 20(b)). Furthermore, a cluster flaw is corrected by subtracting an estimated distribution image from the nonlinearly-corrected image, and then executing point flaw correction processing.

In a case where the technique of the present invention is applied to an APD including a drive circuit of an active recharge type represented by a clock recharge type, the number of counts decreases with respect to the number of incident photons due to a pile-up phenomenon, and response characteristics of photoelectric conversion sometimes indicate nonlinearity.

When a nonlinear response function is represented by the following formula:

$$f(x) = fT \times \left(1 - e^{-\frac{x}{fT}}\right), \quad (1)$$

and the number of counts is denoted by Nct and the number of incident photons is denoted by Nph, Nct=f(Nph) is obtained. At this time, an amount of luminescence caused by a crosstalk is proportional not to the number of incident photons Nph but to the number of counts Nct. On the other hand, the number of total photons Nct' entering pixels subjected to the crosstalk becomes Nc+Ns, where Nc is a pseudo signal attributed to the crosstalk, and Ns is the number of signal photons. In other words, Nct'=f (Nc+Ns) is obtained. Accordingly, in estimating a distribution of pseudo signal photons generated by a crosstalk, a difference from a distribution of actual pseudo signal photons might become large if the estimation is performed based on the number of counts obtained after nonlinear correction.

In view of the foregoing, it is appropriate to estimate a distribution of pseudo signal photons generated by a crosstalk, based on the number of counts obtained before nonlinear correction is performed. A correction error of a cluster flaw can be suppressed by subtracting the obtained distribution from nonlinearly-corrected image data, also in a scene including high-output pixels causing nonlinear influence.

In the present embodiment, by setting 0 as a value at the center of a correction array, overcorrection of a center pixel output can be prevented by subtracting only the influence of a crosstalk that is effected on surrounding pixels by a center pixel of a cluster flaw. Furthermore, correction can be accurately performed by subtracting an estimated output distribution caused by a crosstalk, from a nonlinearly-corrected image, even in a case where cluster flaws exist proximately or even in a case where a signal light amount corresponding to a subject targeted in image capturing is high.

Figure 21:
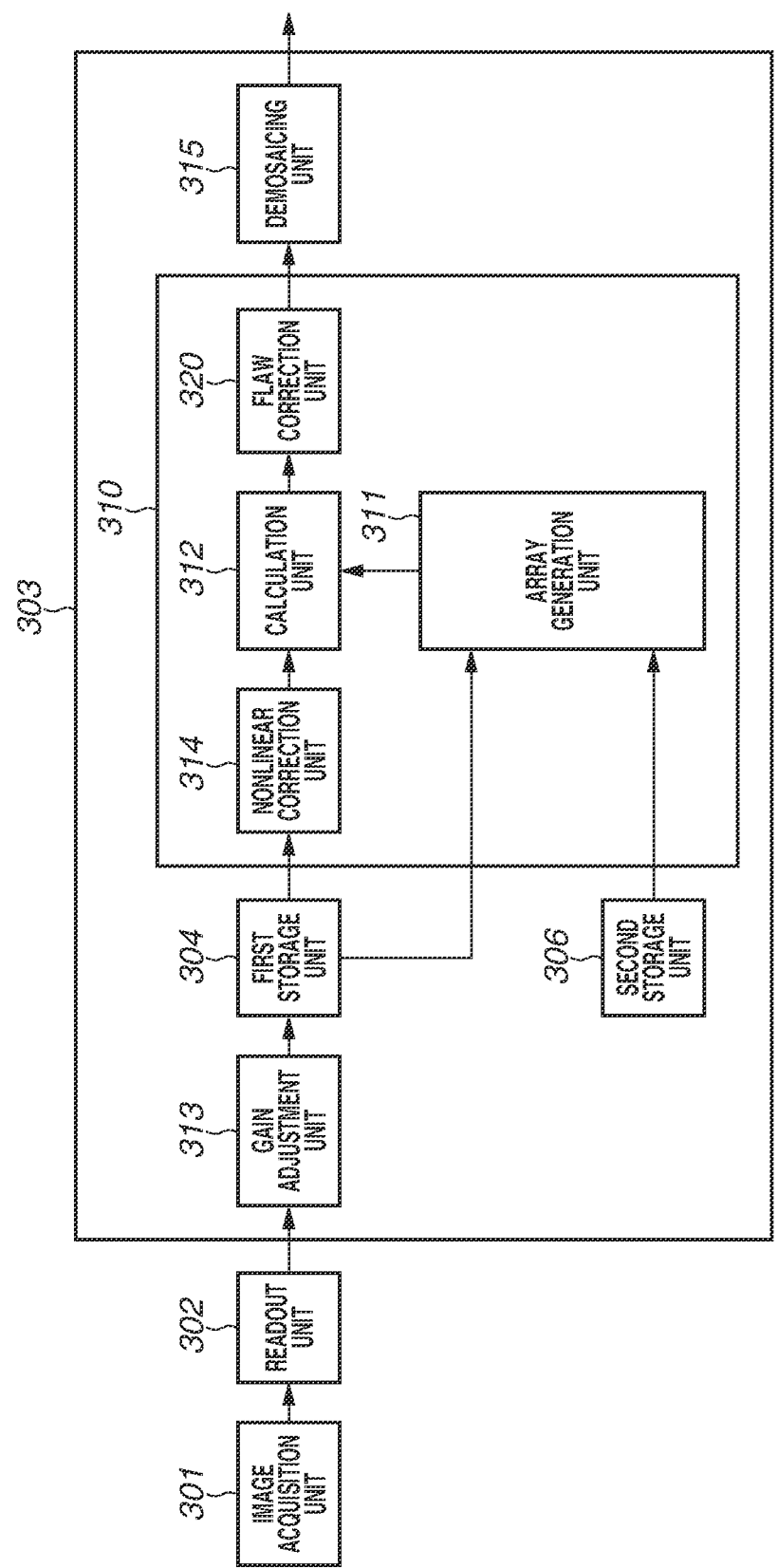
FIG. 21 is a block diagram of the processing apparatus according to the seventh embodiment.

FIG. 21 is a block diagram of the processing apparatus according to the seventh embodiment.

The processing apparatus according to the seventh embodiment includes an image acquisition unit 301, a readout unit 302, and an image processing unit 303. The image processing unit 303 includes a gain adjustment unit 313, a first storage unit 304, a second storage unit 306, a correction unit 310, and a demosaicing unit 315. The correction unit 310 includes a nonlinear correction unit 314, a calculation unit 312, an array generation unit 311, and a flaw correction unit 320.

The image acquisition unit 301 corresponds to the pixel 101 in the pixel region 12 illustrated in FIG. 2, for example, and the readout unit 302 corresponds to the signal processing unit 103 in illustrated FIG. 3, for example. Image data generated by the image acquisition unit 301 is input to the first storage unit 304.

At least a part of the image data having been generated in the previous unit is gain-adjusted by the gain adjustment unit 313, and the first storage unit 304 stores the gain-adjusted data as first array data. Specifically, the first array data is stored using a memory, such as an SRAM, as a storage unit.

The second storage unit 306 stores second array data for correction. The second array data for correction is a crosstalk matrix. The second storage unit 306 can store a plurality of types of correction array data.

The nonlinear correction unit 314 is arranged between the first storage unit 304 and the calculation unit 312, and corrects image data. The array generation unit 311 generates third array data by performing calculation based on the first array data stored in the first storage unit 304, and the second array data stored in the second storage unit 306. For example, a convolution operation is performed. The calculation unit 312 subtracts the third array data generated by the array generation unit 311, from array data corrected by the nonlinear correction unit 314.

The flaw correction unit 320 is a correction processing unit that performs flaw correction processing on a corrected image obtained by the calculation unit 312. The flaw correction unit 320 has a function as a flaw extraction unit that extracts a flaw pixel, and performs flaw correction processing on an output of the extracted flaw pixel.

The demosaicing unit 315 is provided as a subsequent unit of the calculation unit 312, and performs demosaicing processing on the flaw-corrected array data.

Figure 22:
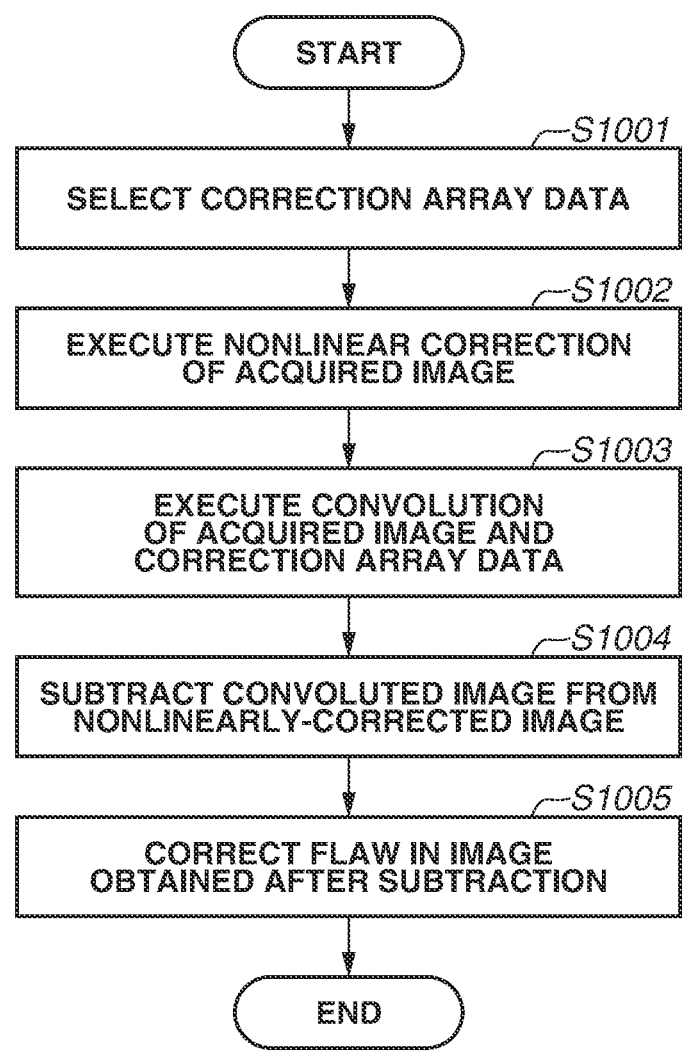
FIG. 22 is a flowchart illustrating processing to be executed by the processing apparatus according to the seventh embodiment.

FIG. 22 is a flowchart illustrating processing to be executed by the processing apparatus according to the seventh embodiment.

In step S1001, correction array data is selected.

In step S1002, nonlinear correction of the acquired image is performed.

In step S1003, a convolution operation of the acquired image and the correction array data is performed.

In step S1004, the convoluted image is subtracted from the nonlinearly-corrected image.

In step S1005, flaw correction processing is performed on the image obtained after the subtraction.

According to the processing apparatus according to the present embodiment, the correction of a cluster flaw that uses a flaw correction algorithm for a point flaw can be performed while reducing nonlinear influence.

Figure 23:
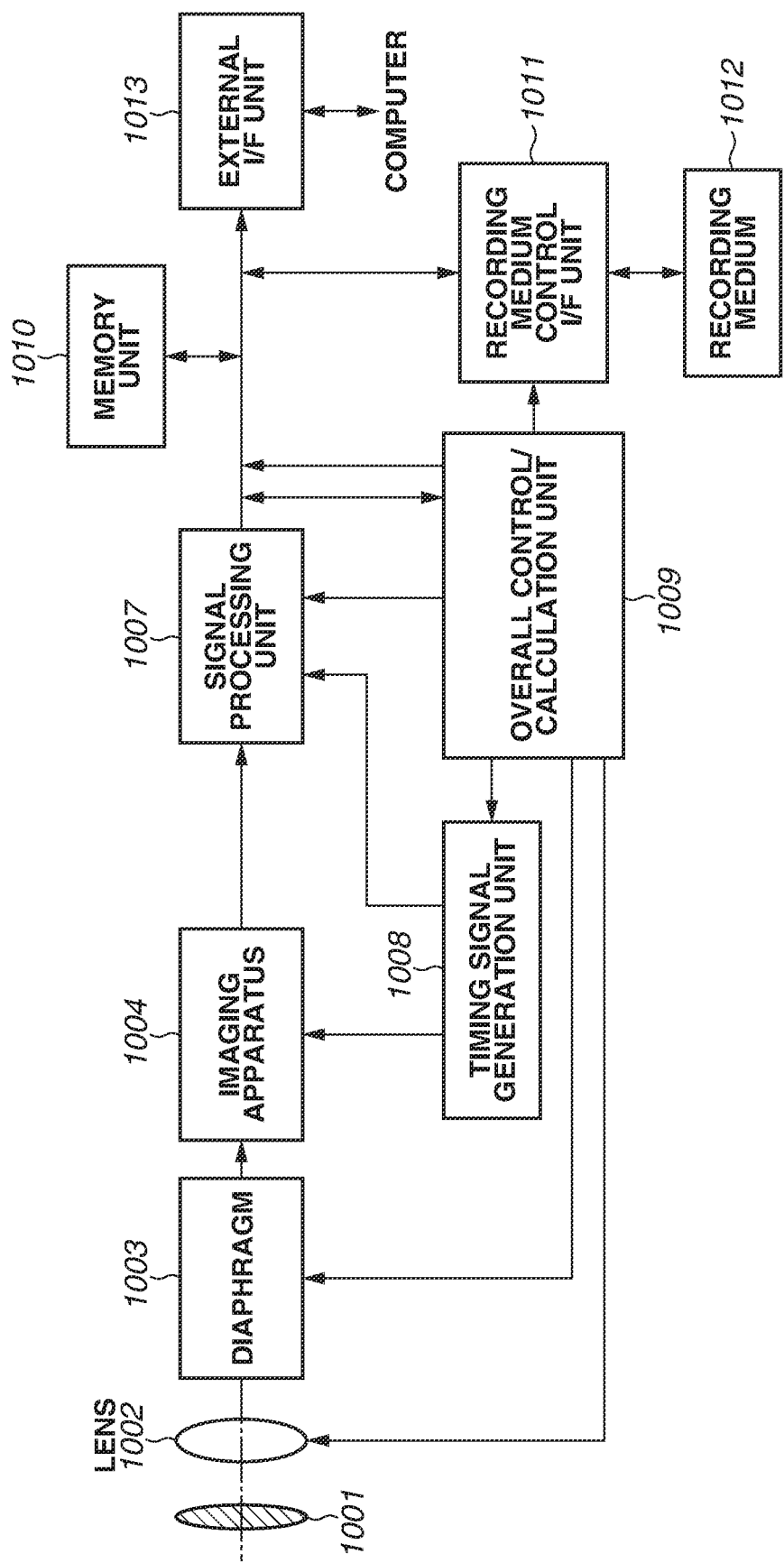
FIG. 23 is a functional block diagram of a photoelectric conversion system including a processing apparatus according to an eighth embodiment.

A photoelectric conversion system according to an eighth embodiment will now be described with reference to FIG. 23. FIG. 23 is a block diagram illustrating a schematic configuration of the photoelectric conversion system according to the present embodiment.

The processing apparatus described in the above-described first to seventh embodiments can be applied to various photoelectric conversion systems. Examples of photoelectric conversion systems to which the processing apparatus can be applied include a digital still camera, a digital camcorder, a monitoring camera, a copier, a facsimile, a mobile phone, an in-vehicle camera, and an observation satellite. A camera module including an optical system such as a lens, and an imaging apparatus is also included in the above-described photoelectric conversion systems. As an example of these photoelectric conversion systems, FIG. 23 exemplarily illustrates a block diagram of a digital still camera.

The photoelectric conversion system exemplified in FIG. 23 includes an imaging apparatus 1004 serving as an example of the photoelectric conversion apparatus, and a lens 1002 that forms an optical image of a subject on the imaging apparatus 1004. The photoelectric conversion system further includes a diaphragm 1003 for varying an amount of light passing through the lens 1002, and a barrier 1001 for protecting the lens 1002. The lens 1002 and the diaphragm 1003 serve as an optical system that focuses light onto the imaging apparatus 1004. The imaging apparatus 1004 is the photoelectric conversion apparatus according to any of the above-described embodiments, and converts an optical image formed by the lens 1002, into an electric signal.

The photoelectric conversion system further includes a signal processing unit 1007 serving as an image generation unit that generates an image by processing an output signal output by the imaging apparatus 1004. The signal processing unit 1007 performs an operation of outputting image data after performing various types of correction and compression as necessary. The processing apparatuses according to the first to fourth embodiments may be formed as a part of the signal processing unit 1007. The signal processing unit 1007 can be formed on a semiconductor substrate on which the imaging apparatus 1004 is provided, or can be formed on a semiconductor substrate different from that of the imaging apparatus 1004.

The photoelectric conversion system further includes a memory unit 1010 for temporarily storing image data, and an external interface unit (external I/F unit) 1013 for communicating with an external computer. The photoelectric conversion system further includes a recording medium 1012, such as a semiconductor memory, for recording or reading out captured image data, and a recording medium control I/F unit 1011 for performing recording onto or readout from the recording medium 1012. The recording medium 1012 may be built into the photoelectric conversion system, or may be detachably attached to the photoelectric conversion system.

The photoelectric conversion system further includes an overall control/calculation unit 1009 that controls various types of calculation and the entire digital still camera, and a timing signal generation unit 1008 that outputs various timing signals to the imaging apparatus 1004 and the signal processing unit 1007. The timing signals can be input from the outside. The photoelectric conversion system is only required to include at least the imaging apparatus 1004 and the signal processing unit 1007 that processes an output signal output from the imaging apparatus 1004.

The imaging apparatus 1004 outputs an imaging signal to the signal processing unit 1007. The signal processing unit 1007 outputs image data after performing predetermined signal processing on the imaging signal output from the imaging apparatus 1004. The signal processing unit 1007 generates an image using the imaging signal.

In this manner, according to the present embodiment, a photoelectric conversion system to which the processing apparatus according to any of the above-described embodiments is applied can be realized.

Figure 24A:
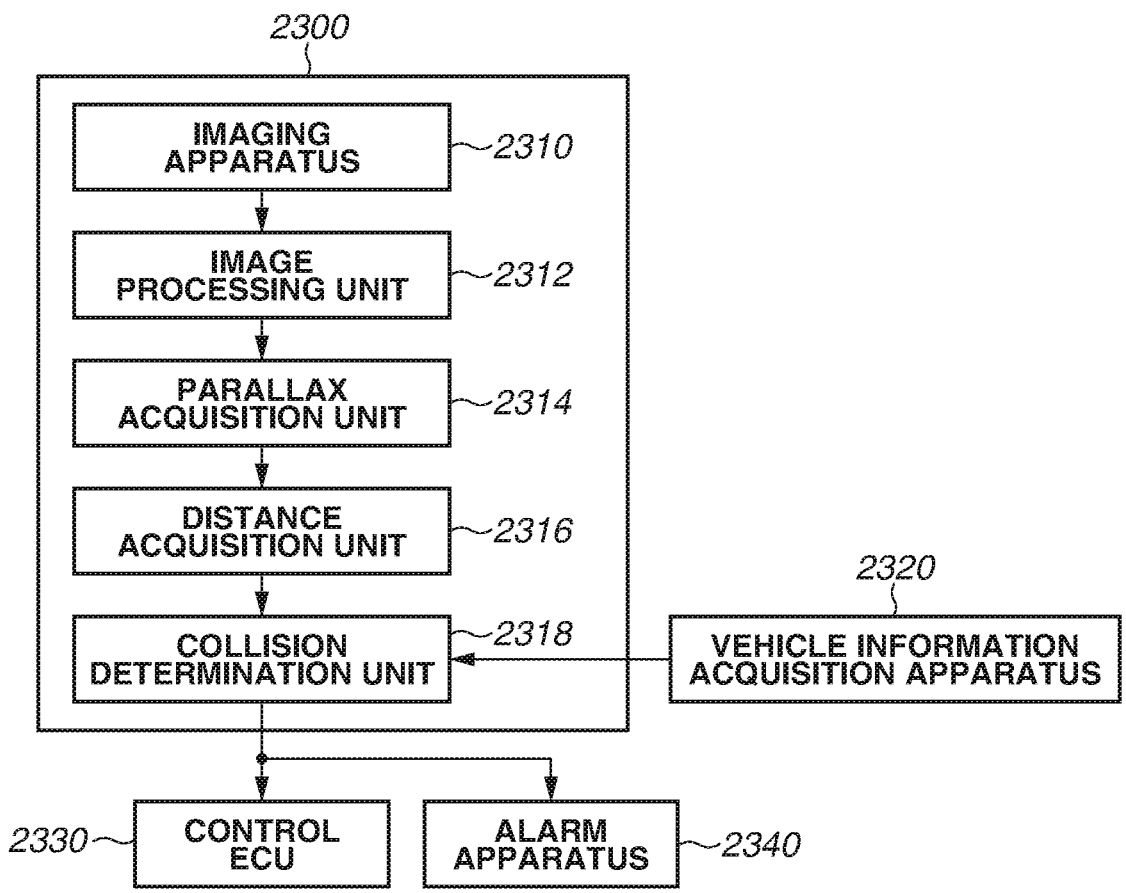
FIGS. 24A and 24B are functional block diagrams illustrating a photoelectric conversion system including a processing apparatus according to a ninth embodiment.
Figure 24B:
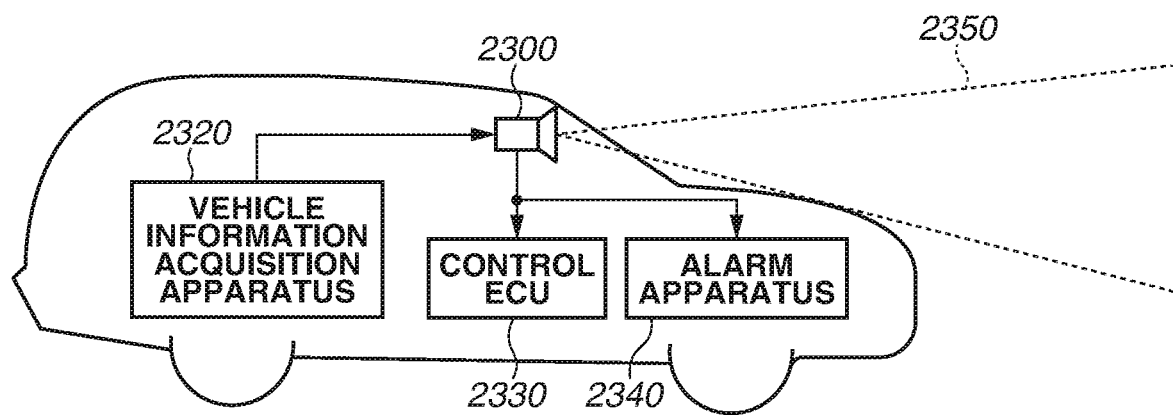

A photoelectric conversion system and a movable body according to a ninth embodiment will now be described with reference to FIGS. 24A and 24B. FIGS. 24A and 24B are diagrams illustrating configurations of the photoelectric conversion system and the movable body according to the present embodiment.

FIG. 24A illustrates an example of a photoelectric conversion system related to an in-vehicle camera. A photoelectric conversion system 2300 includes an imaging apparatus 2310. The imaging apparatus 2310 is the photoelectric conversion apparatus according to any of the above-described embodiments. The photoelectric conversion system 2300 includes an image processing unit 2312 that performs image processing on a plurality of pieces of image data acquired by the imaging apparatus 2310. The photoelectric conversion system 2300 further includes a parallax acquisition unit 2314 that calculates a parallax (phase difference between parallax images) from the plurality of pieces of image data acquired by the photoelectric conversion system 2300. The processing apparatuses according to the first to fourth embodiments may be formed as a part of the image processing unit 2312. The photoelectric conversion system 2300 further includes a distance acquisition unit 2316 that calculates a distance to a target object based on the calculated parallax, and a collision determination unit 2318 that determines whether collision is likely to occur, based on the calculated distance. In this example, the parallax acquisition unit 2314 and the distance acquisition unit 2316 serve as an example of a distance information acquisition unit that acquires distance information regarding a distance to a target object. More specifically, the distance information is information regarding a parallax, a defocus amount, and a distance to a target object. The collision determination unit 2318 may determine collision likelihood using any of these pieces of distance information. The distance information acquisition unit can be implemented by dedicatedly-designed hardware, or can be implemented by a software module. Alternatively, the distance information acquisition unit can be implemented by a field programmable gate array (FPGA) or an application specific integrated circuit (ASIC), or can be implemented by the combination of these.

The photoelectric conversion system 2300 is connected with a vehicle information acquisition apparatus 2320, and can acquire vehicle information, such as vehicle speed, a yaw rate, or a rudder angle. In addition, a control electronic control unit (ECU) 2330 is connected to the photoelectric conversion system 2300. The ECU 2330 serves as a control unit that outputs a control signal for causing a vehicle to generate braking force, based on a determination result obtained by the collision determination unit 2318. The photoelectric conversion system 2300 is also connected with an alarm apparatus 2340 that raises an alarm to a driver based on a determination result obtained by the collision determination unit 2318. For example, in a case where the determination result obtained by the collision determination unit 2318 indicates high collision likelihood, the control ECU 2330 performs vehicle control to avoid collision or reduce damages by braking, release a gas pedal, or suppress engine output. The alarm apparatus 2340 issues an alarm to a user by sounding an alarm such as warning sound, displaying warning information on a screen of a car navigation system, or vibrating a seatbelt or a steering wheel.

In the present embodiment, the photoelectric conversion system 2300 captures an image of the periphery of the vehicle, such as the front side or the rear side. FIG. 24B illustrates the photoelectric conversion system 2300 for capturing an image of a vehicle front side (imaging range 2350). With such a configuration, the accuracy of distance measurement can be further enhanced.

The above description has been given of an example in which control is performed in such a manner as not to collide with another vehicle. The photoelectric conversion system can also be applied to the control for performing automatic operation by following another vehicle, or the control for performing automatic operation in such a manner as not to deviate from a traffic lane. Furthermore, the photoelectric conversion system can be applied to a movable body (moving apparatus) such as a vessel, an aircraft, or an industrial robot aside from a vehicle such as an automobile. Moreover, the photoelectric conversion system can be applied to a device that extensively uses object recognition, such as an intelligent transport system (ITS), in addition to a movable body.

A photoelectric conversion system according to a tenth embodiment will now be described with reference to FIG. 25. FIG. 25 is a block diagram illustrating a configuration example of a distance image sensor serving as the photoelectric conversion system according to the present embodiment.

As illustrated in FIG. 25, a distance image sensor 401 includes an optical system 402, a photoelectric conversion apparatus 403, an image processing circuit 404, a monitor 405, and a memory 406. Then, the distance image sensor 401 can acquire a distance image corresponding to a distance to a subject 400, by receiving light (modulated light or pulse light) that has been projected from a light source apparatus 411 toward the subject 400, and reflected on the front surface of the subject 400.

The optical system 402 includes one or a plurality of lenses, and forms an image on a light receiving surface (sensor portion) of the photoelectric conversion apparatus 403 by guiding image light (incident light) from the subject 400 to the photoelectric conversion apparatus 403.

The photoelectric conversion apparatus according to any of the above embodiments is applied to the photoelectric conversion apparatus 403, and a distance signal indicating a distance obtained from a light receiving signal output from the photoelectric conversion apparatus 403 is supplied to the image processing circuit 404.

The image processing circuit 404 performs image processing of constructing a distance image, based on the distance signal supplied from the photoelectric conversion apparatus 403. Then, a distance image (image data) obtained by the image processing is supplied to the monitor 405 and displayed thereon, or supplied to the memory 406 and stored (recorded) therein. The processing apparatuses according to the first to fourth embodiments may be formed as a part of the image processing circuit 404.

By applying the above-described photoelectric conversion apparatus, the distance image sensor 401 having the above-described configuration can acquire a more accurate distance image in accordance with characteristic enhancement of a pixel, for example.

Figure 26:
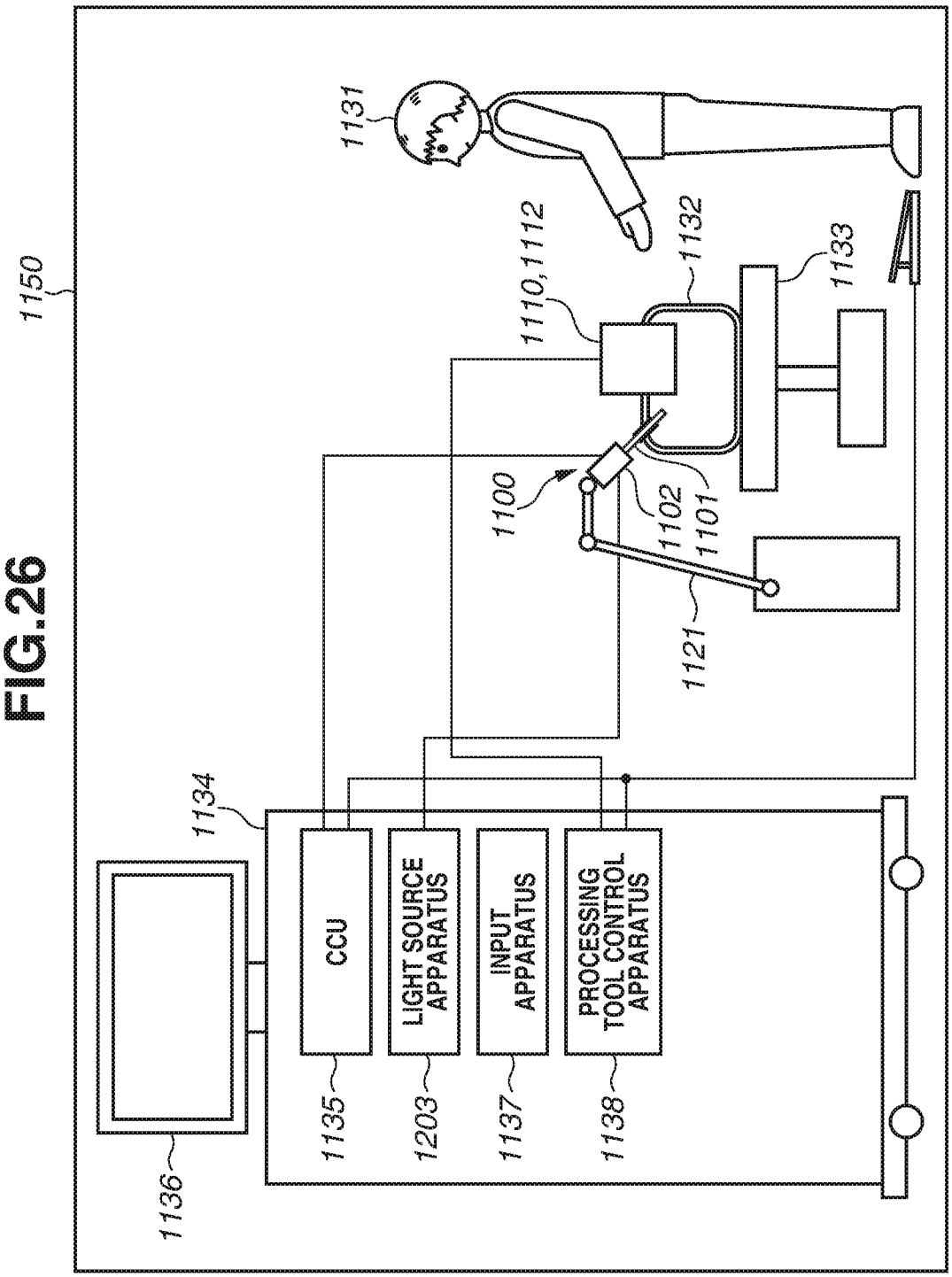
FIG. 26 is a functional block diagram of a photoelectric conversion system including a processing apparatus according to an eleventh embodiment.

A photoelectric conversion system according to an eleventh embodiment will be described with reference to FIG. 26. FIG. 26 is a diagram illustrating an example of a schematic configuration of an endoscopic operation system serving as a photoelectric conversion system of the present embodiment.

FIG. 26 illustrates a state in which an operator (doctor) 1131 is performing an operation on a patient 1132 lying on a patient bed 1133, using an endoscopic operation system 1150. As illustrated in FIG. 26, the endoscopic operation system 1150 includes an endoscope 1100, a surgical tool 1110, and a cart 1134 equipped with various apparatuses for an endoscopic operation.

The endoscope 1100 includes a lens barrel 1101 having a region to be inserted into a body cavity of the patient 1132 by a predetermined length from a distal end, and a camera head 1102 connected to a base end of the lens barrel 1101. In the example illustrated in FIG. 26, the endoscope 1100 formed as a so-called rigid scope including the rigid lens barrel 1101 is illustrated, but the endoscope 1100 can be formed as a so-called flexible scope including a flexible lens barrel.

An opening portion into which an objective lens is fitted is provided at the distal end of the lens barrel 1101. A light source apparatus 1203 is connected to the endoscope 1100, and light generated by the light source apparatus 1203 is guided to the distal end of the lens barrel 1101 by a light guide extended inside the lens barrel 1101, and emitted onto an observation target in the body cavity of the patient 1132 via the objective lens. The endoscope 1100 can be a direct view endoscope, an oblique view endoscope, or a lateral view endoscope.

An optical system and a photoelectric conversion apparatus are provided inside the camera head 1102. Reflected light (observation light) from an observation target is condensed by the optical system to the photoelectric conversion apparatus. The observation light is photoelectrically-converted by the photoelectric conversion apparatus, and an electric signal corresponding to the observation light (i.e., image signal corresponding to an observed image) is generated. The photoelectric conversion apparatus according to any of the above embodiments can be used as the photoelectric conversion apparatus. The image signal is transmitted to a camera control unit (CCU) 1135 as RAW data.

The CCU 1135 includes a central processing unit (CPU) or a graphics processing unit (GPU), and comprehensively controls operations of the endoscope 1100 and a display device 1136. The CCU 1135 receives an image signal from the camera head 1102, and performs various types of image processing for displaying an image that is based on the image signal, such as development processing (demosaicing processing), on the image signal.

Based on the control from the CCU 1135, the display device 1136 displays an image that is based on an image signal on which image processing has been performed by the CCU 1135.

The light source apparatus 1203 includes a light source such as a light emitting diode (LED), and supplies irradiating light for capturing an image of an operative site, to the endoscope 1100.

An input apparatus 1137 is an input interface for the endoscopic operation system 1150. A user can input various types of information and instructions to the endoscopic operation system 1150 via the input apparatus 1137.

A processing tool control apparatus 1138 controls the driving of an energy processing tool 1112 for cauterizing or cutting a tissue, or sealing a blood vessel.

The light source apparatus 1203 that supplies irradiating light for capturing an image of an operative site, to the endoscope 1100 can include, for example, an LED, a laser light source, or a white light source including a combination of these. In a case where a white light source includes a combination of RGB laser light sources, white balance of a captured image can be adjusted in the light source apparatus 1203 because output intensity and an output timing of each color (each wavelength) can be controlled highly accurately. In this case, an image corresponding to each of RGB can be captured in a time division manner by emitting laser light from each RGB laser light source onto an observation target in a time division manner, and controlling the driving of an image sensor of the camera head 1102 in synchronization with the emission timing. According to the method, a color image can be obtained without providing a color filter in the image sensor.

The driving of the light source apparatus 1203 can be controlled to change the intensity of light to be output, every predetermined time. By acquiring images in a time division manner by controlling the driving of the image sensor of the camera head 1102 in synchronization with the change timing of the light intensity, and by combining the images, it is possible to generate a high dynamic range image without black underexposures and overexposed whites.

The light source apparatus 1203 can be configured to supply light in a predetermined wavelength band adapted to special light observation. In the special light observation, wavelength dependency of light absorption in body tissues is utilized, for example. Specifically, an image of a predetermined tissue such as a blood vessel in a superficial portion of a mucous membrane is captured with high contrast by emitting light in a narrower band as compared with irradiating light (i.e., white light) in normal observation.

Alternatively, in special light observation, fluorescent observation to obtain an image by fluorescence generated by emitting excitation light can be performed. In the fluorescent observation, fluorescence from a body tissue can be observed by emitting excitation light onto the body tissue, or a fluorescent image can be obtained by locally injecting reagent, such as indocyanine green (ICG), into a body tissue and emitting excitation light suitable for a fluorescence wavelength of the reagent, onto the body tissue. The light source apparatus 1203 can be configured to supply narrowband light and/or excitation light adapted to such special light observation.

Figure 27A:
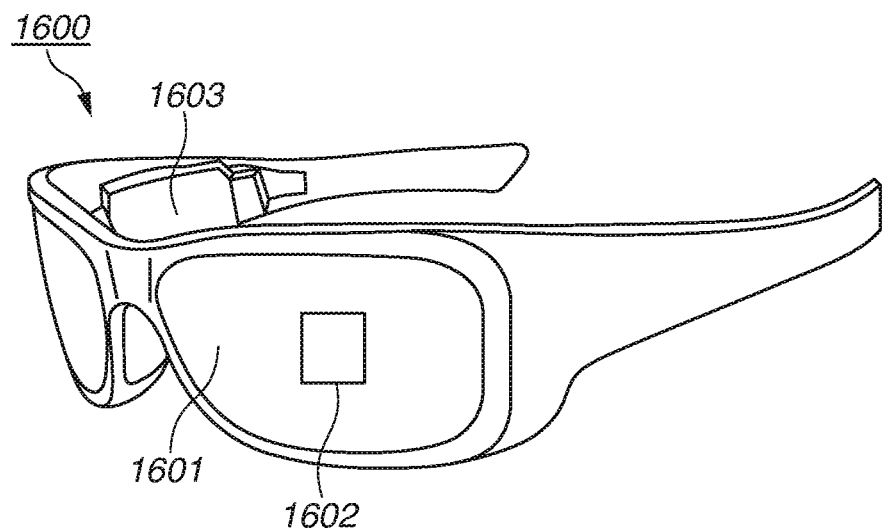
FIGS. 27A and 27B illustrate a photoelectric conversion system including a processing apparatus according to a twelfth embodiment.

A photoelectric conversion system according to a twelfth embodiment will now be described with reference to FIGS. 27A and 27B. FIG. 27A illustrates eyeglasses 1600 (smart glass) serving as a photoelectric conversion system according to the present embodiment. The eyeglasses 1600 include a photoelectric conversion apparatus 1602. The photoelectric conversion apparatus 1602 is the photoelectric conversion apparatus described in any of the above-described embodiments. A display device including a light emission device, such as an organic light emitting diode (OLED) or an LED, can be provided on the back surface side of a lens 1601. The number of photoelectric conversion apparatuses 1602 can be one or plural. A plurality of types of photoelectric conversion apparatuses can be used in combination. An arrangement position of the photoelectric conversion apparatus 1602 is not limited to the position illustrated in FIG. 27A.

The eyeglasses 1600 further include a control apparatus 1603. The control apparatus 1603 functions as a power source that supplies power to the photoelectric conversion apparatus 1602 and the above-described display device. The control apparatus 1603 controls operations of the photoelectric conversion apparatus 1602 and the display device. In the lens 1601, an optical system for condensing light to the photoelectric conversion apparatus 1602 is formed.

Figure 27B:
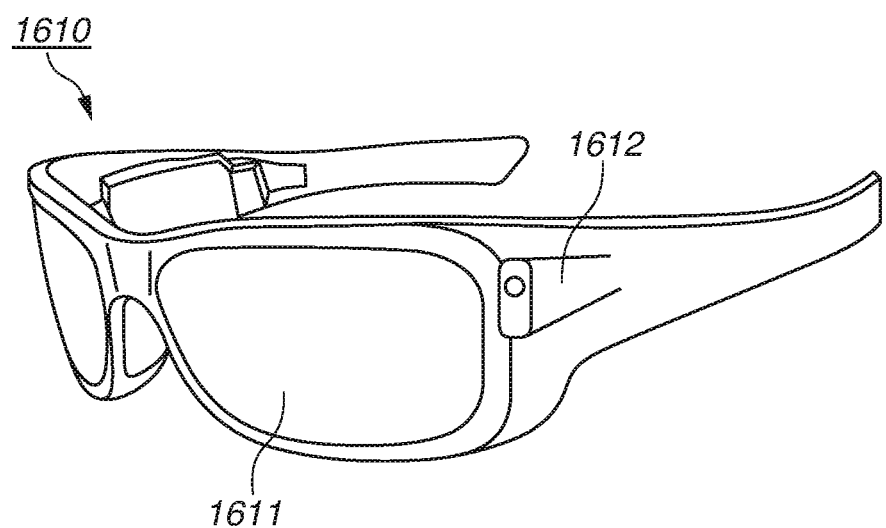

FIG. 27B illustrates eyeglasses 1610 (smart glass) according to one application example. The eyeglasses 1610 include a control apparatus 1612, and the control apparatus 1612 is equipped with a photoelectric conversion apparatus equivalent to the photoelectric conversion apparatus 1602, and a display device. In a lens 1611, an optical system for projecting light emitted from the photoelectric conversion apparatus and the display device in the control apparatus 1612 is formed, and an image is projected onto the lens 1611. The control apparatus 1612 functions as a power source that supplies power to the photoelectric conversion apparatus and the display device, and controls operations of the photoelectric conversion apparatus and the display device. The control apparatus may include a visual line detection unit that detects a visual line of a wearer. Infrared light can be used for the detection of a visual line. An infrared light emission unit emits infrared light onto an eyeball of a user looking at a displayed image. An imaging unit including a light receiving element detects reflected light of the emitted infrared light that has been reflected from the eyeball. A captured image of the eyeball is thereby obtained. By including a reduction unit for reducing light from the infrared light emission unit to a display unit in a planar view, deterioration in image quality is suppressed.

From a captured image of an eyeball obtained by the image capturing using infrared light, a visual line of a user with respect to a displayed image is detected. Any known method can be applied to visual line detection that uses a captured image of an eyeball. As an example, a visual line detection method that is based on a Purkinje image obtained by reflection of irradiating light on a cornea can be used.

More specifically, visual line detection processing that is based on the pupil center corneal reflection is performed. Using the pupil center corneal reflection, a visual line of a user is detected by calculating an eye vector representing the direction (rotational angle) of an eyeball, based on an image of a pupil and a Purkinje image that are included in a captured image of the eyeball.

The display device according to the present embodiment can include the photoelectric conversion apparatus including a light receiving element, and a displayed image on the display device can be controlled based on visual line information of the user from the photoelectric conversion apparatus.

Specifically, in the display device, a first eyeshot region viewed by the user, and a second eyeshot region other than the first eyeshot region are determined based on the visual line information. The first eyeshot region and the second eyeshot region can be determined by a control apparatus of the display device, or the first eyeshot region and the second eyeshot region determined by an external control apparatus can be received. In a display region of the display device, a display resolution of the first eyeshot region can be controlled to be higher than a display resolution of the second eyeshot region. In other words, a resolution of the second eyeshot region can be made lower than a resolution of the first eyeshot region.

The display region includes a first display region and a second display region different from the first display region. Based on the visual line information, a region with high priority can be determined from the first display region and the second display region. The first display region and the second display region can be determined by a control apparatus of the display device, or the first display region and the second display region determined by an external control apparatus may be received. A resolution of a region with high priority can be controlled to be higher than a resolution of a region other than the region with high priority. In other words, a resolution of a region with relatively-low priority can be set to a low resolution.

Artificial intelligence (AI) can be used for determining the first eyeshot region and the region with high priority. The AI can be a model configured to estimate an angle of a visual line, and a distance to a target existing at the end of the visual line, from an image of an eyeball using training data including an image of the eyeball, and a direction in which the eyeball in the image actually gives a gaze. An AI program can be included in the display device, can be included in the photoelectric conversion apparatus, or can be included in an external apparatus. In a case where an external apparatus includes an AI program, the AI program is transmitted to the display device through communication.

In a case where display control is performed based on visual detection, the present invention can be preferably applied to smart glasses further including a photoelectric conversion apparatus that captures an image of the outside. The smart glasses can display external information obtained by image capturing, in real time.

Modified Embodiment

The present invention is not limited to the above-described embodiments, and various modifications can be made.

The embodiments of the present invention include, for example, an example in which a partial configuration of a certain embodiment is added to another embodiment, and an example in which a partial configuration of a certain embodiment is replaced with a partial configuration of another embodiment.

The photoelectric conversion systems described in the above-described eighth and ninth embodiments indicate examples of photoelectric conversion systems to which a photoelectric conversion apparatus can be applied, and a photoelectric conversion system to which a photoelectric conversion apparatus according to an embodiment of the present invention can be applied is not limited to the configurations illustrated in FIGS. 23 and 24A and 24B. The same applies to the TOF system described in the tenth embodiment, the endoscope described in the eleventh embodiment, and the smart glasses described in the twelfth embodiment.

Each of the above-described embodiments merely indicates a specific example in carrying out the present invention, and the technical scope of the present invention is not to be construed in a limiting manner based on these. In other words, embodiments of the present invention can be implemented in various forms without departing from the technical idea or major features thereof.

The present disclosure includes the following configurations.

(Configuration 1)
A processing apparatus includes a first storage unit for storing first array data that is based on output values of a plurality of pixels arranged in an array, and a second storage unit having second array data stored therein to be used for correction of the output values from the plurality of pixels. The processing apparatus further includes a correction unit including a calculation unit configured to correct an output value of at least one pixel of the plurality of pixels based on the first array data and the second array data.

(Configuration 2)
The processing apparatus according to Configuration 1 further includes a flaw extraction unit configured to extract an output value and a position of a flaw pixel from the first array data, and an array generation unit configured to generate third array data based on the second array data and the output value and the position of the flaw pixel. Furthermore, the calculation unit corrects an output value of at least one surrounding pixel positioned around the flaw pixel, based on the first array data and the third array data.

(Configuration 3)
The processing apparatus according to Configuration 1, in which the correction unit includes a flaw correction unit, and the flaw correction unit corrects a flaw pixel in fourth array data generated by the calculation unit.

(Configuration 4)
The processing apparatus according to Configuration 2 or 3, in which the second array data includes at least three pieces of data, and one-dimensional data corresponding to at least one row or one column of the second array data has a peak value or a bottom value at a center.

(Configuration 5)
The processing apparatus according to Configuration 4, in which the one-dimensional data has a distribution monotonously changing from the peak value or the bottom value toward data ends.

(Configuration 6)
The processing apparatus according to Configuration 4 or 5, in which different one-dimensional data that shares the peak value or the bottom value of the one-dimensional data, and is arrayed in a direction intersecting with the one-dimensional data has a distribution monotonously changing from a peak value or a bottom value of the different one-dimensional data toward data ends.

(Configuration 7)
The processing apparatus according to any one of Configurations 2 to 6, in which the first array data includes data of N rows and M columns, where one of the N and the M is an integer larger than or equal to 2, and the other one of the N and the M is an integer larger than or equal to 1.

(Configuration 8)
The processing apparatus according to Configuration 2, in which the second storage unit has a plurality of types of the second array data stored therein, and the array generation unit selects a type of the second array data to be used in accordance with an environment in which image capturing is performed.

(Configuration 9)
The processing apparatus according to Configuration 2, in which the third array data is generated by multiplication of the second array data and array data generated based on an output value of the flaw pixel.

(Configuration 10)
The processing apparatus according to Configuration 3, in which the fourth array data is generated by division of the first array data and the second array data.

(Configuration 11)
The processing apparatus according to any one of Configurations 2 to 10, in which the flaw extraction unit extracts a flaw pixel based on address data of the flaw pixel that has been acquired in advance.

(Configuration 12)
The processing apparatus according to any one of Configurations 2 to 11, in which, in a case where a difference between an output value of a first pixel and an output value of a second pixel adjacent to the first pixel is larger than or equal to a fixed threshold value, the flaw extraction unit determines the first pixel or the second pixel to be a flaw pixel.

(Configuration 13)
The processing apparatus according to any one of Configurations 2 to 12, in which, in a case where a ratio between an output value of a first pixel and an output value of a second pixel adjacent to the first pixel is larger than or equal to a fixed threshold value, the flaw extraction unit determines the first pixel or the second pixel to be a flaw pixel.

(Configuration 14)
The processing apparatus according to any one of Configurations 2 to 13, in which the flaw extraction unit determines a pixel having the output value that is larger than or equal to a fixed threshold value, to be a flaw pixel.

(Configuration 15)
The processing apparatus according to any one of Configurations 2 to 14, in which a gain adjustment unit configured to apply a digital gain to the output values of the plurality of pixels is provided as a preceding unit of the first storage unit.

(Configuration 16)
The processing apparatus according to any one of Configurations 2 to 15, in which the correction unit includes a nonlinear correction unit configured to perform nonlinear correction of the first array data.

(Configuration 17)
The processing apparatus according to Configuration 16, in which the calculation unit generates correction array data based on first array data obtained before the nonlinear correction is performed, and the second array data. The calculation unit corrects an output value of at least one pixel of the plurality of pixels based on first array data obtained after the nonlinear correction has been performed, and the correction array data.

(Configuration 18)
The processing apparatus according to Configuration 17, in which the second array data includes at least three pieces of data, and a center value of one-dimensional data corresponding to at least one row or one column of the second array data is zero.

(Configuration 19)

The processing apparatus according to any one of Configurations 2 to 18, in which the correction unit includes a demosaicing unit as a subsequent unit of the calculation unit.
(Configuration 20)

The processing apparatus according to any one of Configurations 2 to 19, in which, based on address data of the flaw pixel or an output value of the flaw pixel that has been extracted from the output values of the plurality of pixels in a first frame, correction of output values of the plurality of pixels in a second frame acquired later than the first frame is performed.
(Configuration 21)

The processing apparatus according to any one of Configurations 2 to 20, in which, whether or not to execute the correction in the calculation unit is selected in accordance with a signal level of a subject or a temperature of the plurality of pixels.
(Configuration 22)

The processing apparatus according to any one of Configurations 2 to 21, in which the second array data is generated based on a pattern of a flaw pixel in an OB region of the plurality of pixels.
(Configuration 23)

The processing apparatus according to Configuration 2, in which, after an output value of the surrounding pixel has been corrected by the calculation unit, an output value of the flaw pixel is corrected based on the corrected output value of the surrounding pixel.
(Configuration 24)

The processing apparatus according to any one of Configurations 2 to 23, in which the flaw extraction unit extracts a flaw pixel by pattern matching.
(Configuration 25)

A photoelectric conversion system includes the processing apparatus according to any one of Configurations 1 to 24, and the plurality of pixels configured to output the first array data.
(Configuration 26)

The photoelectric conversion system according to Configuration 25, in which each of the plurality of pixels includes an avalanche photodiode.

According to an embodiment of the present invention, flaw correction accuracy and image quality can be improved.

While the present invention has been described with reference to embodiments, it is to be understood that the invention is not limited to the disclosed embodiments but is defined by the scope of the following claims.

This application claims the benefit of Japanese Patent Applications No. 2022-021461, filed Feb. 15, 2022, No. 2022-034577, filed Mar. 7, 2022, and No. 2022-188829, filed Nov. 28, 2022, which are hereby incorporated by reference herein in their entirety.

What is claimed is:

1. A processing apparatus comprising:
a first storage unit for storing first array data that is based on output values of a plurality of pixels arranged in an array;
a second storage unit having second array data stored therein to be used for correction of the output values from the plurality of pixels;
a correction unit including a calculation unit configured to correct an output value of at least one pixel of the plurality of pixels based on the first array data and the second array data;
a flaw extraction unit configured to extract an output value and a position of a flaw pixel from the first array data; and
an array generation unit configured to generate third array data based on the second array data and the output value and the position of the flaw pixel,
wherein the second array data is generated based on a pattern of a flaw pixel in an optical black (OB) region of the plurality of pixels.

2. The processing apparatus according to claim 1,
wherein the calculation unit is configured to correct an output value of at least one surrounding pixel positioned around the flaw pixel, based on the first array data and the third array data.

3. The processing apparatus according to claim 2, wherein, after an output value of the surrounding pixel has been corrected by the calculation unit, an output value of the flaw pixel is corrected based on the corrected output value of the surrounding pixel.

4. The processing apparatus according to claim 1,
wherein the correction unit includes a flaw correction unit, and
wherein the flaw correction unit is configured to correct a flaw pixel in fourth array data generated by the calculation unit.

5. The processing apparatus according to claim 4, wherein the fourth array data is generated by division of the first array data and the second array data.

6. The processing apparatus according to claim 1,
wherein the second array data includes at least three pieces of data, and
wherein one-dimensional data corresponding to at least one row or one column of the second array data has a peak value or a bottom value at a center.

7. The processing apparatus according to claim 6, wherein the one-dimensional data has a distribution monotonously changing from the peak value or the bottom value toward data ends.

8. The processing apparatus according to claim 6, wherein different one-dimensional data that shares the peak value or the bottom value of the one-dimensional data, and is arrayed in a direction intersecting with the one-dimensional data has a distribution monotonously changing from a peak value or a bottom value of the different one-dimensional data toward data ends.

9. The processing apparatus according to claim 1, wherein the first array data includes data of N rows and M columns, where one of the N and the M is an integer larger than or equal to 2, and the other one of the N and the M is an integer larger than or equal to 1.

10. The processing apparatus according to claim 1, wherein the third array data is generated by multiplication of the second array data and array data generated based on an output value of the flaw pixel.

11. The processing apparatus according to claim 1, wherein the flaw extraction unit extracts a flaw pixel based on address data of the flaw pixel that has been acquired in advance.

12. The processing apparatus according to claim 1, wherein, in a case where a difference between an output value of a first pixel and an output value of a second pixel adjacent to the first pixel is larger than or equal to a fixed threshold value, the flaw extraction unit determines the first pixel or the second pixel to be a flaw pixel.

13. The processing apparatus according to claim 1, wherein, in a case where a ratio between an output value of a first pixel and an output value of a second pixel adjacent to the first pixel is larger than or equal to a fixed threshold value, the flaw extraction unit determines the first pixel or the second pixel to be a flaw pixel.

14. The processing apparatus according to claim 1, wherein the flaw extraction
unit determines a pixel having the output value that is larger than or equal to a fixed threshold value, to be a flaw pixel.

15. The processing apparatus according to claim 1, wherein a gain adjustment unit configured to apply a digital gain to the output values of the plurality of pixels is provided as a preceding unit of the first storage unit.

16. The processing apparatus according to claim 1, wherein the correction unit includes a nonlinear correction unit configured to perform nonlinear correction of the first array data.

17. The processing apparatus according to claim 16, wherein the calculation unit is configured to generate correction array data based on first array data obtained before the nonlinear correction is performed, and the second array data, and correct an output value of at least one pixel of the plurality of pixels based on first array data obtained after the nonlinear correction has been performed, and the correction array data.

18. The processing apparatus according to claim 17,
wherein the second array data includes at least three pieces of data, and
wherein a center value of one-dimensional data corresponding to at least one row or one column of the second array data is zero.

19. The processing apparatus according to claim 1, wherein the correction unit includes a demosaicing unit as a subsequent unit of the calculation unit.

20. The processing apparatus according to claim 1, wherein, based on address data of the flaw pixel or an output value of the flaw pixel that has been extracted from the output values of the plurality of pixels in a first frame, correction of output values of the
plurality of pixels in a second frame acquired later than the first frame is performed.

21. The processing apparatus according to claim 1, wherein, whether to execute the correction in the calculation unit is selected in accordance with a signal level of a subject or a temperature of the plurality of pixels.

22. The processing apparatus according to claim 1, wherein the flaw extraction unit is configured to extract a flaw pixel by pattern matching.

23. A photoelectric conversion system comprising:
the processing apparatus according to claim 1; and
the plurality of pixels configured to output the first array data.

24. The photoelectric conversion system according to claim 23, wherein each of the plurality of pixels includes an avalanche photodiode.

* * * * *